(12) United States Patent
Funk et al.

(10) Patent No.: US 7,567,700 B2
(45) Date of Patent: Jul. 28, 2009

(54) DYNAMIC METROLOGY SAMPLING WITH WAFER UNIFORMITY CONTROL

(75) Inventors: Merritt Funk, Austin, TX (US); Radha Sundararajan, Dripping Springs, TX (US); Daniel Joseph Prager, Hopewell Junction, NY (US); Wesley Natzle, New Paltz, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 700 days.

(21) Appl. No.: 11/390,469

(22) Filed: Mar. 28, 2006

(65) Prior Publication Data

US 2007/0237383 A1    Oct. 11, 2007

(51) Int. Cl.
*G06K 9/00* (2006.01)
(52) U.S. Cl. ..................................................... 382/144
(58) Field of Classification Search .......... 382/141–149
See application file for complete search history.

(56) References Cited

U.S. PATENT DOCUMENTS

| | | | |
|---|---|---|---|
| 6,352,591 B1 | 3/2002 | Yieh et al. |
| 6,828,542 B2 | 12/2004 | Ye et al. |
| 6,881,665 B1 | 4/2005 | Tsui et al. |
| 6,947,141 B2 | 9/2005 | Bischoff et al. |
| 7,078,344 B2 | 7/2006 | Bailey et al. |
| 2002/0193899 A1 | 12/2002 | Shanmugasundram et al. |
| 2003/0204348 A1 | 10/2003 | Suzuki et al. |
| 2004/0267399 A1 | 12/2004 | Funk |
| 2005/0132306 A1 | 6/2005 | Smith et al. |
| 2005/0187649 A1 | 8/2005 | Funk et al. |
| 2006/0007453 A1 | 1/2006 | Horak et al. |
| 2006/0042543 A1 | 3/2006 | Funk et al. |
| 2006/0047356 A1 | 3/2006 | Funk |
| 2006/0064193 A1 | 3/2006 | Yamashita et al. |

OTHER PUBLICATIONS

International Search Report in Application No. PCT/US07/060953 mailed Feb. 14, 2008.
International Search Report in Application No. PCT/US07/060960 mailed Feb. 20, 2008.
Office Action issued in copending related U.S. Appl. No. 11/390,412, mailed Mar. 19, 2008.
International Preliminary Report on Patentability issued in Application No. PCT/US07/060953 mailed Oct. 9, 2008.
Written Opinion in International Application PCT/US07/060953 mailed Feb. 14, 2008.
International Preliminary Report on Patentability issued in Application No. PCT/US07/060960 mailed Oct. 9, 2008.

(Continued)

*Primary Examiner*—Daniel G Mariam

(57) ABSTRACT

A method of processing a wafer is presented that includes creating a pre-processing measurement map using measured metrology data for the wafer including metrology data for at least one isolated structure on the wafer, metrology data for at least one nested structure on the wafer, or mask data. At least one pre-processing prediction map is calculated for the wafer. A pre-processing confidence map is calculated for the wafer. The pre-processing confidence map includes a set of confidence data for the plurality of dies on the wafer. A prioritized measurement site is determined when the confidence data for one or more dies is not within the confidence limits. A new measurement recipe that includes the prioritized measurement site is then created.

24 Claims, 27 Drawing Sheets

OTHER PUBLICATIONS

Written Opinion In International Application No. PCT/US07/060960 mailed Feb. 20, 2008.

International Search Report issued in International Application No. PCT/US07/060951 mailed Sep. 25, 2007.

Written Opinion in International Application No. PCT/US07/060951 mailed Sep. 25, 2007.

Notice of Allowance issued in U.S. Appl. No. 11/390,412 mailed Oct. 30, 2008.

|     | 0 | 1 | 2 | 3 | 4 | 5 | 6 | 7 | 8 | 9 | 10 | 11 | 12 |
|-----|---|---|---|---|---|---|---|---|---|---|----|----|----|
| 0   |   |   |   | Q1 | 0-4 | 0-5 | 0-6 | 0-7 | 0-8 |   |    | Q2 |    |
| 1   |   |   |   | 1-3 | 1-4 | 1-5 | 5 | 1-7 | 1-8 | 1-9 |    |    |    |
| 2   |   |   | 2-2 | 2-3 | 2-4 | 2-5 | 2-6 | 10 | 2-8 | 2-9 | 2-10 |    |    |
| 3   |   | 3-1 | 3-2 | 3-3 | 3-4 | 3-5 | 3-6 | 3-7 | 3-8 | 3-9 | 3-10 | 3-11 |    |
| 4   |   | 4-1 | 4-2 | 4-3 | 4-4 | 4 | 4-6 | 4-7 | 4-8 | 4-9 | 4-10 | 12 |    |
| 5   | 5-0 | 5-1 | 5-2 | 5-3 | 5-4 | 5-5 | 5-6 | 9 | 5-8 | 5-9 | 5-10 | 5-11 | 5-12 |
| 6   | 6-0 | 6-1 | 2 | 6-3 | 6-4 | 3 | 6-6 | 6-7 | 6-8 | 6-9 | 11 | 6-11 | 6-12 |
| 7   | 7-0 | 7-1 | 7-2 | 7-3 | 7-4 | 7-5 | 7-6 | 8 | 7-8 | 7-9 | 7-10 | 7-11 | 7-12 |
| 8   |   | 1 | 8-2 | 8-3 | 8-4 | 8-5 | 8-6 | 8-7 | 8-8 | 8-9 | 8-10 | 8-11 |    |
| 9   |   | 9-1 | 9-2 | 9-3 | 9-4 | 9-5 | 6 | 9-7 | 9-8 | 9-9 | 9-10 | 9-11 |    |
| 10  |   |   | 10-2 | 10-3 | 10-4 | 10-5 | 10-6 | 10-7 | 10-8 | 10-9 | 10-10 |    |    |
| 11  |   |   |   | 11-3 | 11-4 | 11-5 | 11-6 | 7 | 11-8 | 11-9 |    | Q3 |    |
| 12  |   |   |   |   | 12-4 | 12-5 | 12-6 | 12-7 | 12-8 |   |    |    |    |

FIG. 8

|     | 0 | 1 | 2 | 3 | 4 | 5 | 6 | 7 | 8 | 9 | 10 | 11 | 12 |
|-----|---|---|---|---|---|---|---|---|---|---|----|----|----|
| 0   |   |   |   |   | 0-4 | 0-5 | 0-6 | 0-7 | 0-8 |   |    |    |    |
| 1   |   | Q1 |  | 1-3 | 1-4 | 1-5 | 5 | 1-7 | 1-8 | 1-9 |   | Q2 |    |
| 2   |   |   | 2-2 | 2-3 | 2-4 | 2-5 | 2-6 | 10 | 2-8 | 2-9 | 2-10 |   |    |
| 3   |   | 3-1 | 3-2 | 3-3 | 3-4 | 3-5 | 3-6 | 3-7 | 3-8 | 3-9 | 3-10 | 3-11 |    |
| 4   |   | 4-1 | 4-2 | 4-3 | 4-4 | 4 | 4-6 | 4-7 | 4-8 | 4-9 | 4-10 | 12 |    |
| 5   | 5-0 | 5-1 | 5-2 | 5-3 | 5-4 | 5-5 | 5-6 | 9 | 5-8 | 5-9 | 5-10 | 5-11 | 5-12 |
| 6   | 6-0 | 6-1 | 2 | 6-3 | 6-4 | 3 | 6-6 | 6-7 | 6-8 | 6-9 | 11 | 6-11 | 6-12 |
| 7   | 7-0 | 7-1 | 7-2 | 7-3 | 7-4 | 7-5 | 7-6 | 8 | 7-8 | 7-9 | 7-10 | 7-11 | 7-12 |
| 8   |   | 1 | 8-2 | 8-3 | 8-4 | 8-5 | 8-6 | 8-7 | 8-8 | 8-9 | 8-10 | 8-11 |    |
| 9   |   | 9-1 | 9-2 | 9-3 | 9-4 | 9-5 | 6 | 9-7 | 9-8 | 9-9 | 9-10 | 9-11 |    |
| 10  |   |   | 10-2 | 10-3 | 10-4 | 10-5 | 10-6 | 10-7 | 10-8 | 10-9 | 10-10 |    |    |
| 11  |   | Q4 |  | 11-3 | 11-4 | 11-5 | 11-6 | 7 | 11-8 | 11-9 |   | Q3 |    |
| 12  |   |   |   |   | 12-4 | 12-5 | 12-6 | 12-7 | 12-8 |   |    |    |    |

FIG. 14

|   | 0 | 1 | 2 | 3 | 4 | 5 | 6 | 7 | 8 | 9 | 10 | 11 | 12 |
|---|---|---|---|---|---|---|---|---|---|---|---|---|---|
| 0 |   | Q1 |   |   | C2 | C2 | C2 | C2 | C2 |   | Q2 |   |   |
| 1 |   |   |   | C2 | C2 | C2 | 5 | C2 | C2 | C2 |   |   |   |
| 2 |   |   | C2 | C2 | C1 | C1 | C1 | 10 | C1 | C2 | C2 |   |   |
| 3 |   | C2 | C2 | C2 | C1 | C1 | C1 | C1 | C1 | C2 | C2 | C2 |   |
| 4 |   | C2 | C2 | C1 | C1 | 4 | C1 | C1 | C1 | C1 | C2 | 12 |   |
| 5 | C2 | C2 | C1 | C1 | C1 | C1 | C1 | 9 | C1 | C1 | C1 | C2 | C2 |
| 6 | C2 | C2 | 2 | C1 | C1 | 3 | C1 | C1 | C1 | C1 | 11 | C2 | C2 |
| 7 | C2 | C2 | C1 | C1 | C1 | C1 | C1 | 8 | C1 | C1 | C1 | C2 | C2 |
| 8 |   | 1 | C2 | C1 | C1 | C1 | C1 | C1 | C1 | C1 | C1 | C2 |   |
| 9 |   | C2 | C2 | C2 | C1 | C1 | 6 | C1 | C1 | C2 | C2 | C2 |   |
| 10 |   |   | C2 | C2 | C1 | C1 | C1 | C1 | C1 | C2 | C2 |   |   |
| 11 |   | Q4 |   | C2 | C2 | C2 | C2 | 7 | C2 | C2 |   | Q3 |   |
| 12 |   |   |   |   | C2 | C2 | C2 | C2 | C2 |   |   |   |   |

|    | 0 | 1 | 2 | 3 | 4 | 5 | 6 | 7 | 8 | 9 | 10 | 11 | 12 |
|----|---|---|---|---|---|---|---|---|---|---|----|----|----|
| 0  | Q1 |   |   |   | 0-4 | 0-5 | 0-6 | 0-7 | 0-8 |   | Q2 |   |   |
| 1  |   |   |   | 1-3 | 1-4 | 1-5 | 5 | 1-7 | 1-8 | 1-9 |   |   |   |
| 2  |   |   | 2-2 | 2-3 | 2-4 | 2-5 | 2-6 | 10 | 2-8 | 2-9 | 2-10 |   |   |
| 3  |   | 3-1 | 3-2 | 3-3 | 3-4 | 3-5 | 3-6 | 3-7 | 3-8 | 3-9 | 3-10 | 3-11 |   |
| 4  |   | 4-1 | 4-2 | 4-3 | 4-4 | 4 | 4-6 | 4-7 | 4-8 | 4-9 | 4-10 | 12 |   |
| 5  | 5-0 | 5-1 | 5-2 | 5-3 | 5-4 | 5-5 | 5-6 | 9 | 5-8 | 5-9 | 5-10 | 5-11 | 5-12 |
| 6  | 6-0 | 6-1 | 2 | 6-3 | 6-4 | 3 | 6-6 | 6-7 | 6-8 | 6-9 | 11 | 6-11 | 6-12 |
| 7  | 7-0 | 7-1 | 7-2 | 7-3 | 7-4 | 7-5 | 7-6 | 8 | 7-8 | 7-9 | 7-10 | 7-11 | 7-12 |
| 8  |   | 1 | 8-2 | 8-3 | 8-4 | 8-5 | 8-6 | 8-7 | 8-8 | 8-9 | 8-10 | 8-11 |   |
| 9  |   | 9-1 | 9-2 | 9-3 | 9-4 | 9-5 | 6 | 9-7 | 9-8 | 9-9 | 9-10 | 9-11 |   |
| 10 |   |   | 10-2 | 10-3 | 10-4 | 10-5 | 10-6 | 10-7 | 10-8 | 10-9 | 10-10 |   |   |
| 11 | Q4 |   |   | 11-3 | 11-4 | 11-5 | 11-6 | 7 | 11-8 | 11-9 |  | Q3 |   |
| 12 |   |   |   |   | 12-4 | 12-5 | 12-6 | 12-7 | 12-8 |   |   |   |   |

FIG. 16

DYNAMIC METROLOGY SAMPLING WITH WAFER UNIFORMITY CONTROL

CROSS-REFERENCE TO RELATED APPLICATIONS

This application is related to co-pending U.S. patent application Ser. No. 10/705,200, entitled "Processing System And Method For Chemically Treating A Wafer", filed on Nov. 12, 2003; co-pending U.S. patent application Ser. No. 10/704,969, entitled "Processing System And Method For Thermally Treating A Wafer", filed on Nov. 12, 2003; co-pending U.S. patent application Ser. No. 10/705,397, entitled "Method And Apparatus for Thermally Insulating Adjacent Temperature Controlled Chambers", filed on Nov. 12, 2003; co-pending U.S. patent application Ser. No. 10/944,463, entitled "Iso/Nested Cascading Trim Control With Model Feedback Updates"; filed Sep. 20, 2004; co-pending U.S. patent application Ser. No. 11/046,903, entitled "Iso/Nested Control For Soft Mask Processing"; filed Feb. 1, 2005; U.S. patent application Ser. No. 11/290,415, entitled "Dynamic Metrology Sampling With Wafer Uniformity Control", filed on even date herewith; and U.S. patent application Ser. No. 11/390,412, entitled "Dynamic Metrology Sampling for a Dual Damascene Process", filed on even date herewith. The contents of each of these applications are herein incorporated by reference in their entireties.

BACKGROUND OF THE INVENTION

1. Field of the Invention

The present invention relates to a system and method for processing a wafer, and more particularly to a system and method for using run-to-run control to improve within wafer uniformity.

2. Description of the Related Art

The use of feed forward controllers has long been established in the fabrication of semiconductor integrated circuits by semiconductor manufacturing facilities (fabs). Until recently, wafers were treated as a batch or a lot, with the same processing performed on each of the wafers in the lot. The size of the lot varies depending on the manufacturing practices of the fab but is typically limited to a maximum of 25 wafers. Measurements were routinely made on a few wafers in the lot and adjustments made to the processing based on these sample measurements. This method of control based on sample measurements on the lot and process recipe adjustments for the following lots is called lot-to-lot (L2L) control. The process models and information necessary to modify the process recipes for L2L control were kept and the computations were performed at the fab level. Recently, manufacturers of semiconductor processing equipment (SPE) have included the ability to measure each wafer immediately before and after the processing is performed. The capability to measure each wafer on the processing tool is called integrated metrology (IM). IM enabled the ability to measure and adjust the process recipe at the wafer-to-wafer (W2W) level.

The structures on the semiconductor wafers have not only decreased in size but also have increased in density causing additional processing control problems. Areas on semiconductor wafers have been identified as being isolated areas or nested areas based on the density of structures within the particular area and problems have developed in the semiconductor processing due to these different densities.

The need for trim etch has become common, and many methods have been developed for trimming the Critical Dimension (CD) for gate length control. Iso/nested control has become part of the mask design process, including the modeling of the process through the etcher. The iso/nested model designed into the mask making process however is optimized for a single CD target related to an isolated or nested structure. Mask bias control utilizes optical and process correction (OPC), sometimes called optical proximity correction, in which the apertures of the reticle are adjusted to add or subtract the necessary light to increase pattern fidelity. Another approach is phase-shift masks (PSM), in which topographic structures are created on the reticle to introduce contrast-enhancing interference fringes in the image.

SUMMARY OF THE INVENTION

The principles of the present invention are directed to a method of processing a wafer, wherein the wafer includes a plurality of dies, each die having a patterned bi-layer mask thereon. The mask layer includes a soft mask layer and a hard mask layer. A pre-processing measurement map is created using measured metrology data for the wafer including metrology data for at least one isolated bi-layer structure on the wafer, metrology data for at least one nested bi-layer structure on the wafer, or mask data. A first pre-processing prediction map for the wafer is calculated based on the pre-processing measurement map. The first pre-processing prediction map includes a first set of predicted measured data for the plurality of dies on the wafers. A pre-processing confidence map for the wafer is calculated. The pre-processing confidence map includes a set of confidence data for the plurality of dies on the wafer, wherein the confidence data is determined using a difference between the first pre-processing prediction map and historical data. A prioritized measurement site is calculated when the confidence data for one or more dies is not within the confidence limits. A new measurement recipe is created that includes the prioritized measurement site.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 illustrates an exemplary view of a pre-processing prediction map in accordance with an embodiment of the invention;

FIG. 14 illustrates an exemplary view of a post-processing prediction map in accordance with an embodiment of the invention;

FIG. 15 illustrates an exemplary view of a post-processing confidence map in accordance with embodiments of the invention;

FIG. 16 shows an exemplary view of a new post-processing measurement map in accordance with embodiments of the invention.

DETAILED DESCRIPTION OF SEVERAL EMBODIMENTS

In material processing methodologies, pattern etching comprises the application of a thin layer of light-sensitive material, such as photoresist, to a wafer that is subsequently patterned in order to provide a soft mask for transferring this pattern to the underlying material during etching. The patterning of the light-sensitive material generally involves exposure by a radiation source of the light-sensitive material using, for example, a microlithography system, followed by the removal of the irradiated regions of the light-sensitive material (as in the case of positive photoresist), or non-irradiated regions (as in the case of negative resist) using a developing solvent.

Additionally, single and/or multi-layer masks can be implemented. Soft mask and/or hard mask layers can be used. For example, when etching features using a soft mask top layer, the mask pattern in the soft mask layer is transferred to the hard mask layer using a separate etch step (hard mask open) preceding the other etch steps. The soft mask can be selected from several materials for silicon processing including, but not limited to, ArF resist materials or photoresist materials compatible with smaller feature sizes, The hard mask can, for example, be selected from several materials for silicon processing including, but not limited to, silicon dioxide ($SiO_2$), silicon nitride ($Si_3N_4$), and carbon.

Figure 1:
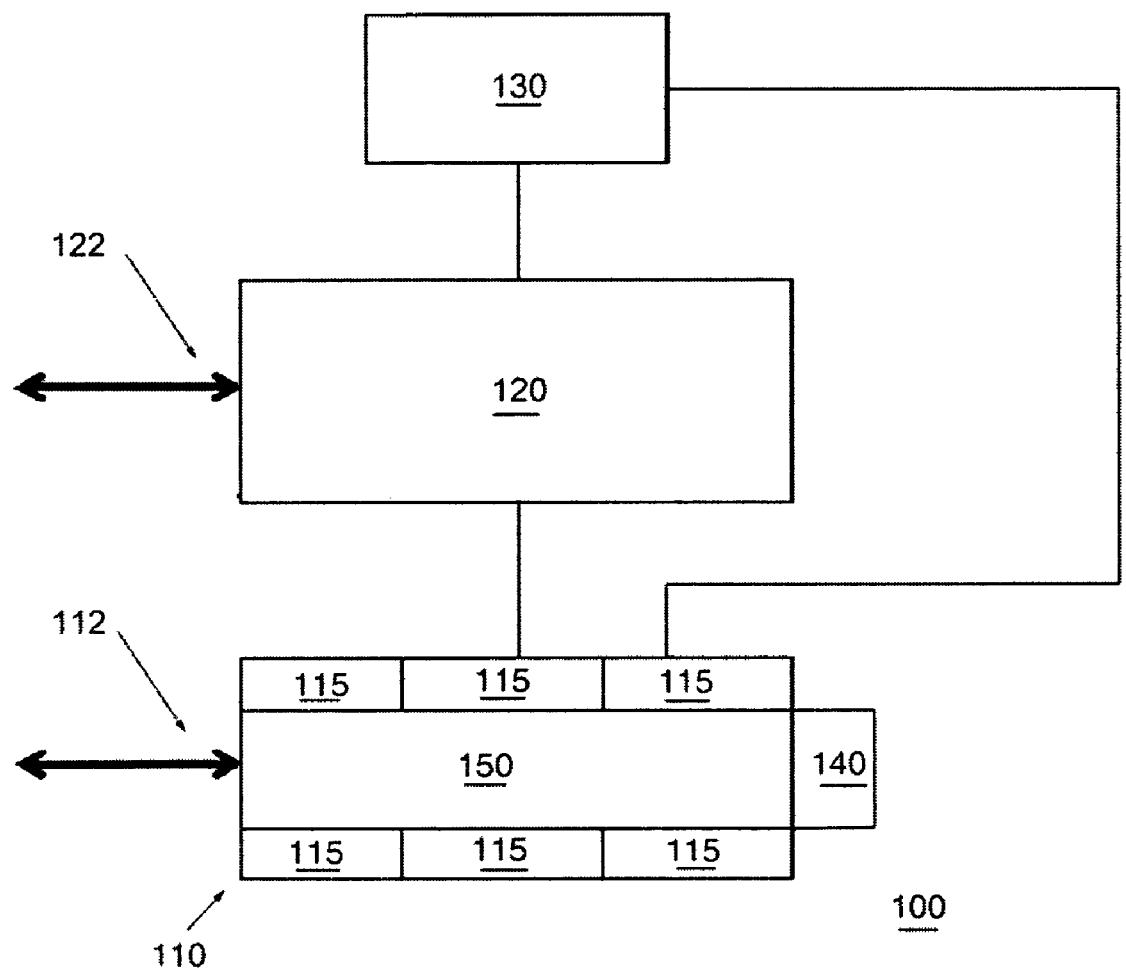
FIG. 1 shows an exemplary block diagram of a processing system in accordance with an embodiment of the present invention.

FIG. 1 shows an exemplary block diagram of a processing system in accordance with an embodiment of the present invention. In the illustrated embodiment, processing system 100 comprises a processing tool 110, a controller 120 coupled to the processing tool 110, and a manufacturing equipment system (MES) 130 coupled to the processing tool 110 and the controller 120. The processing tool 110 can include a number of processing modules 115 that can be coupled to a transfer system 150

In addition, an integrated metrology module (IMM) 140 can be coupled to the processing tool 110. For example, the IMM 140 can be coupled to the transfer system 150. Alternatively, the IMM 140 may be coupled to the processing tool 110 in a different manner. At least one of the processing tool 110, the controller 120, the MES 130, and the IMM 140 can comprise a control component, a Graphical User Interface (GUI) component and/or a database component (not shown). In alternate embodiments, one or more of these components may not be required.

Some setup and/or configuration information can be obtained by the processing tool 110 and/or the controller 120 from the factory system 130. Factory level business rules can be used to establish a control hierarchy. Business rules can be used to specify the action taken for normal processing and the actions taken on error conditions. For example, the processing tool 110 and/or the controller 120 can operate independently, or can be controlled to some degree by the factory system 130. Also, factory level business rules can be used to determine when a process is paused and/or stopped, and what is done when a process is paused and/or stopped. In addition, factory level business rules can be used to determine when to change a process and how to change the process.

Business rules can be defined at a control strategy level, a control plan level or a control model level. Business rules can be assigned to execute whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in the database. Documentation and help screens can be provided on how to define, assign, and maintain the business rules.

The MES 130 can be configured to monitor some system processes using data reported from the databases associated with the processing tool 110 and/or the controller 120. Factory level business rules can be used to determine which processes are monitored and which data is used. For example, the processing tool 110 and/or the controller 120 can independently collect data, or the data collection process can be controlled to some degree by the factory system 130. Also, factory level business rules can be used to determine how to manage the data when a process is changed, paused and/or stopped.

In addition, the MES 130 can provide run-time configuration information to the processing tool 110 and/or the controller 120. Data can be exchanged using GEM SECS communications protocol. For example, APC settings, targets, limits, rules, and algorithms can be downloaded from the factory to the processing tool 110 and/or the controller 120 as an "APC recipe", an "APC system rule", and "APC recipe parameters". Measurement system recipes and settings can be downloaded from the factory to the processing tool 110 and/or the controller 120 as an "IMM recipe", an "IMM system rule", and "IMM recipe parameters".

In general, rules allow system and/or tool operation to change based on the dynamic state of the processing system 100. Some setup and/or configuration information can be determined by the processing tool 110 and/or the controller 120 when they are initially configured by the processing system 100. In addition, tool level rules can be used to establish a control hierarchy at the tool level. For example, the processing tool 110 and/or the IMM 140 can operate independently, or the IMM 140 can be controlled to some degree by the processing tool 110. Also, tool level rules can be used to determine when a process is paused and/or stopped, and what is done when a process is paused and/or stopped. In addition, tool rules can be used to determine when to change a process, how to change the process, and how to manage the data.

In FIG. 1, one processing tool 110, and one controller 120 are shown, but this is not required for the invention. The semiconductor processing system can comprise any number of processing tools having any number of controllers associated with them in addition to independent process tools and modules.

The processing tool 110 and/or the controller 120 can be used to configure any number of processing tools having any number of processing tools associated with them in addition to any number of independent process tools and modules. Among other functions, the processing tool 110 and/or the controller 120 can collect, provide, process, store, and display data from processes involving processing tools, processing subsystems, process modules, and sensors.

The processing tool 110 and/or the controller 120 can comprise a number of applications including at least one tool-related application, at least one module-related application, at least one sensor-related application, at least one interface-related application, at least one database-related application, at least one GUI-related application, and at least one configuration application, among others.

For example, the system 100 can comprise an APC system from Tokyo Electron Limited that can interface with a Unity® Tool, a Telius® Tool and/or a Trias® Tool and their associated processing subsystems and process modules. In addition, the system can comprise a run-to-run (R2R) controller, such as the Ingenio® TL ES server from Tokyo Electron Limited, and an integrated metrology module (IMM) from Tokyo Electron Limited. Alternately, the controller 120 can support other process tools and other process modules.

A GUI component (not shown) can provide easy to use interfaces that enable users to: view tool status and process module status; create and edit x-y charts of summary and raw (trace) parametric data for selected wafers; view tool alarm logs; configure data collection plans that specify conditions for writing data to the database or to output files; input files to Statistical Process Control (SPC) charting, modeling and spreadsheet programs; examine wafer processing information for specific wafers, and review data that is currently being saved to the database; create and edit SPC charts of process parameters, and set SPC alarms which generate e-mail warnings; run multivariate Principal Component Analysis (PCA) and/or Partial Least Squares (PLS) models; and view diagnostics screens in order to troubleshoot and report problems with the TL controller 120. As should be apparent to those skilled in the art, the GUI component need not provide interfaces for all functions. Instead the GUI may provide interfaces for any subset of these functions or others not listed here.

Controller 120 can include a memory (not shown) that can include one or more databases. Data from the tool can be stored as files in a database. In addition, IM data and host metrology data can be stored in the database. The amount of data depends on the data collection plans that are configured, as well as the frequency with which processes are performed and processing tools are run. The data obtained from the processing tools, the processing chambers, the sensors, and the operating system can be stored in the database.

In an alternate embodiment, the system 100 can comprise a client workstation (not shown). The system 100 can support a plurality of client workstations. A client workstation can allow a user to perform configuration procedures; to view status including tool, controller, process, and factory status; to view current and historical data; to perform modeling and charting functions; and to input data to the controller. For example, a user may be provided with administrative rights that allow him to control one or more processes performed by a system component.

Processing tool 110 and the controller 120 can be coupled to MES 130 and can be part of an E-Diagnostic System. The processing tool 110 and/or the controller 120 can exchange information with a factory system. In addition, the MES 130 can send command and/or override information to the processing tool 110 and/or the controller 120. For example, the MES 130 can feed-forward to the processing tool 110 and/or the controller 120 downloadable recipes for any number of process modules, tools, and measuring devices, with variable parameters for each recipe. Variable parameters can include final CD targets, limits, offsets, and variables in the tool level system that needs to be adjustable by lot. In addition, metrology data can be feed-forwarded to controller 120 from a factory system or a lithography tool, such as a Lithius® tool from Tokyo Electron Limited.

Furthermore, the MES 130 can be used to provide measurement data, such as Critical Dimension Scanning Electron Microscope (CD SEM) information, to the controller 120. Alternately, the CD SEM information can be provided manually. Adjustment factors are used to adjust for any offset between the IM and CD SEM measurements. The measurement and/or historical data can include wafer identification information and a timestamp, such as a date, for proper insertion in to the database.

A single processing tool 110 is also shown in FIG. 1, but this is not required for the invention. Alternately, additional processing tools can be used. In one embodiment, a processing tool 110 can comprise one or more processing modules. Processing tool 110 can comprise an etch module, a deposition module, a measurement module, a polishing module, a coating module, a developing module, or a thermal treatment module, or any combination of two or more thereof.

Processing tool 110 can comprise link 112 for coupling to at least one other processing tool and/or controller. For example, other processing tools and/or controllers can be associated with a process that has been performed before this process, and/or other controllers can be associated with a process that is performed after this process. Link 112 can be used to feed forward and/or feed back information. For example, feed forward information can comprise data associated with an in-coming wafer. This data can include lot data, batch data, run data, composition data, and wafer history data.

The IMM 140 can include an Optical Digital Profiling (ODP) system. The processing tool 110 can also include module related measurement devices, tool-related measurement devices, and external measurement devices. For example, data can be obtained from sensors coupled to one or more process modules and sensors coupled to the processing tool. Sensors can include an Optical Emission Spectroscopy (OES) sensor or an optical end point detection sensor. For example, the wavelength ranges for these sensors can extend from 200 nm to 900 nm. In addition, data can be obtained from an external device such as a Scanning Electron Microscopy (SEM) tool, a Transmission Electron Microscopy (TEM) tool, and an Optical Digital Profiling (ODP) tool.

An ODP tool is available for Timbre Technologies Inc. (a TEL company) that provides a patented technique for measuring the profile of a structure in a semiconductor device. For example, ODP techniques can be used to obtain critical dimension (CD) information, structure profile information, or via profile information.

Controller 120 is coupled to processing tool 110 and MES 130, and information such as pre-processing data and post-processing data can be exchanged between them. For example, when an internal error event is generated by the tool, the controller 120 can send a message, containing information about the event, to the MES 130. This can allow the factory system and/or factory personnel to make the necessary changes to minimize the number of wafers at risk after a major change occurs such as those that occur during corrective or preventative maintenance.

A single controller 120 is also shown in FIG. 1, but this is not required for the invention. Alternately, additional controllers can be used. For example, the controller 120 can comprise at least one of a run-to-run (R2R) controller, a feed-forward (FF) controller, a process model controller, a feedback (FB) controller, and a process controller (all not shown in FIG. 1).

Controller 120 can comprise link 122 for coupling to at least one other controller. For example, other controllers can be associated with a process that has been performed before this process, and/or other controllers can be associated with a process that is performed after this process. Link 122 can be used to feed forward and/or feedback information.

In one case, the controller 120 knows the input state and a model equation for the desired state for the wafer, and the controller determines a set of recipes that can be performed on the wafer to change the wafer from the input state to a processed state. In another case, the controller 120 determines the input state and desired state for the wafer, and the controller 120 determines a set of recipes that can be performed on the wafer to change the wafer from the input state to the desired state. For example, the set of recipes can describe a multi-step process involving a set of process modules.

One time constant for the controller 120 can be based on the time between measurements. When measured data is available after a lot is completed, the controller's time constant can be based on the time between lots. When measured data is available after a wafer is completed, the controller's time constant can be based on the time between wafers. When measurement data is provided real-time during processing, the controller's time constant can be based on processing steps, within a wafer. When measured data is available while a wafer is being processed or after a wafer is completed or after the lot is completed, the controller 120 can have multiple time constants that can be based on the time between process steps, between wafers, and/or between lots.

One or more controllers 120 can be operating at any point in time. For example, one controller 120 can be in an operating mode while a second controller 120 can be in a monitoring mode. In addition, another controller 120 can be operating in a simulation mode. A controller can comprise a single loop or multiple loops, and the loops can have different time constants. For example, loops can be dependent on wafer timing, lot timing, batch timing, chamber timing, tool timing, and/or factory timing.

The controller can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. In addition, models can include SPC charts, PLS models, PCA models, Fault Detection and Classification (FDC) models, and Multivariate Analysis (MVA) models.

The controller 120 can receive and utilize externally provided data for process parameter limits in a process module. For example, the controller GUI component provides a means for the manual input of the process parameter limits. In addition, a factory level controller can provide limits for process parameters for each process module.

The controller 120 can receive and execute models created by commercially available modeling software. For example, the controller can receive and execute models that were created by external applications and sent to the controller.

In one embodiment, controller 120 can be used to run FDC applications and can send and/or receive information concerning an alarm/fault condition. For example, the controller can send and receive FDC information to and from a factory level controller or a tool level controller. In addition, FDC information can be sent via the e-Diagnostics network, e-mail, or pager after the identification of an error condition. In an alternate embodiment, FDC applications can be run on different controllers.

The controller 120 can take various actions in response to an alarm/fault, depending on the nature of the alarm/fault. The actions taken on the alarm/fault can be based on the business rules established for the context specified by the system recipe, process recipe, module type, module identification number, load port number, cassette number, lot number, control job ID, process job ID, slot number and/or the type of map. In one embodiment, the controller determines the actions to take. Alternately, the controller can be instructed to take some specific actions by the FDC system.

The controller 120 can comprise a database component for archiving input and output data. For example, the controller can archive, among other things, received inputs, sent outputs, and actions taken by the controller in a historical database. In addition, the controller 120 can comprise hardware and/or software for data backup and restoration. Also, the historical database can include model information, configuration information, and historical information and the controller 120 can use the database component to backup and restore model information and model configuration information both historical and current. Furthermore, the historical database can include map information, such as wafer maps and/or process maps, configuration information, and historical information and the controller can use the database component to backup and restore the map information and map configuration information both historical and current.

The controller 120 can comprise a web-based user interface. For example, the controller 120 can comprise a web enabled GUI component for viewing the data in the database. The controller can comprise a security component that can provide for multiple levels of access depending on the permissions granted by a security administrator. The controller 120 also can comprise a set of default models that are provided at installation time and have the ability to reset to default conditions.

The controller has the capability of managing multiple process models that are executed at the same time and are subject to different sets of process recipe constraints. The controller can run in three different modes: simulation mode, test mode, and standard mode. A controller can operate in simulation mode in parallel with the actual process mode. In addition, FDC applications can be run in parallel and produce real-time results.

When the semiconductor processing system includes a host system and one or more processing systems, the host system can operate as the master system and can control and/or monitor a major portion of the processing operations. The host system can create a process sequence, and can send the process sequence to the processing system. In one embodiment, the process sequence can comprise a sequence of measurement module visits and processing module visits.

A process job (PJ) can be created for each measurement module visit and each processing module visit.

In addition, virtual measurements and/or maps can be made when a processing system controller executes in a simulation mode. The results from simulation mode executions can be stored and used to predict process drift and/or potential fault conditions.

A single processing tool 110 is also shown in FIG. 1, but an arrangement including only one processing tool 110 is not required for the invention. Alternately, additional processing tools can be used. In one embodiment, the processing tool 110 can comprise means for performing a trimming procedure as described. Alternatively, the processing tool 110 may comprise an etch module, a deposition module, a polishing module, a coating module, a developing module, an ashing module, an oxidation module, or a thermal treatment module, among others, or any combination of two or more thereof.

Figure 2:
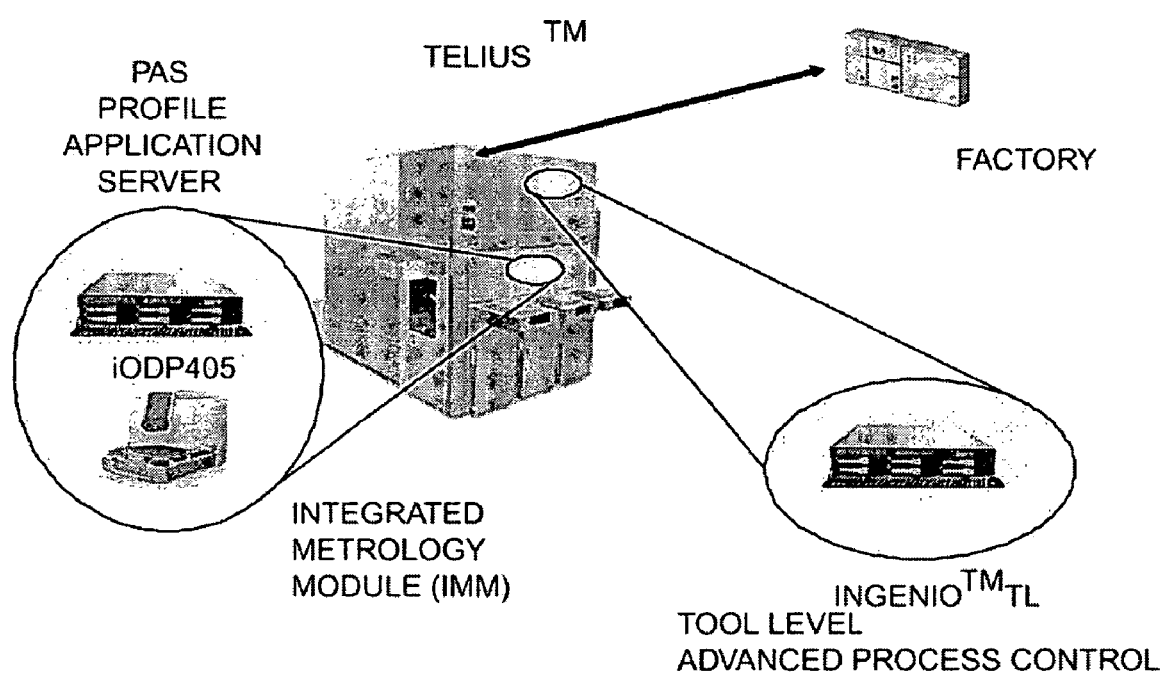
FIG. 2 shows a simplified block diagram of another processing system in accordance with an embodiment of the invention.

FIG. 2 shows a simplified block diagram of an integrated processing system 100' in accordance with an embodiment of the invention. In the illustrated embodiment, a processing system (TELIUS®) is shown that comprises a processing tool, an integrated metrology module (IMM), and a tool level APC controller. As would be appreciated by those skilled in the art, the components of the integrated processing system 100' are intended merely to be exemplary of the system of the present invention. As would be appreciated by those skilled in the art, and as will be made apparent from the discussion that follows, the permutations of combinations of components for the present invention is significant. Each such variation, while not discussed herein, is intended to fall within the scope of the present invention.

The system 100', such as shown in FIG. 2, can provide IMM wafer sampling and the wafer slot selection can be determined using a (PJ Create) function. The R2R control configuration can include, among other variables, feed forward control plan variables, feedback control plan variables, metrology calibration parameters, control limits, and SEMI Standard variable parameters. Metrology data reports can include wafer, site, structure, and composition data, among others, and the tool can report actual settings for the wafer.

The IMM system can include an optical measuring system such as a Timbre Technologies' Optical Digital Profilometry (ODP) system that uses spectroscopic ellipsometry, reflectometry, or other optical instruments to measure true device profiles, accurate critical dimensions (CD), and multiple layer film thickness of a wafer. Timbre Technologies, Inc is a California corporation and wholly owned subsidiary of TEL.

The process is executed in-line, which eliminates the need to break the wafer for performing the analyses. ODP can be used with the existing thin film metrology tools for inline profile and CD measurement, and can be integrated with TEL processing tools to provide real-time process monitoring and control. An ODP profiler can be used both as a high precision metrology tool to provide actual profile, CD, and film thickness results, and a yield enhancement tool to detect in-line process excursion or process faults.

An ODP® solution has three key components: ODP® Profiler™ Library comprises an application specific database of optical spectra and its corresponding semiconductor profiles, CDs, and film thicknesses. Profiler™ Application Server (PAS) comprises a computer server that connects with optical hardware and computer network. It handles the data communication, ODP library operation, measurement process, results generation, results analysis, and results output. The ODP® Profiler™ Software includes the software installed on PAS to manage measurement recipe, ODP® Profiler™ library, ODP® Profiler™ data, ODP® Profiler™ results search/match, ODP® Profiler™ results calculation/analysis, data communication, and PAS interface to various metrology tools and computer network.

An exemplary optical metrology system is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

ODP techniques can be used to measure the presence and/or thickness of coatings and/or residues within features of a patterned wafer. These techniques are taught in co-pending U.S. patent application Ser. No. 10/357,705, entitled "Model Optimization for Structures with Additional Materials" by Niu, et al., filed on Feb. 3, 2003, and ODP techniques covering the measurement of additional materials are taught in U.S. Pat. No. 6,608,690, entitled "Optical Profilometry of Additional-material Deviations in a Periodic Grating", filed on Dec. 4, 2001, and in U.S. Pat. No. 6,839,145, entitled "Optical Profilometry of Additional-material Deviations in a Periodic Grating", filed on May 5, 2003, and all are incorporated by reference herein.

ODP techniques for creating a metrology model are taught in co-pending U.S. patent application Ser. No. 10/206,491, entitled "Model and Parameter Selection in Optical Metrology" by Voung, et al., filed on Jul. 25, 2002 and ODP techniques covering integrated metrology applications are taught in U.S. Pat. No. 6,785,638, entitled METHOD AND SYSTEM OF DYNAMIC LEARNING THROUGH A REGRESSION-BASED LIBRARY GENERATION PROCESS, filed on Aug. 6, 2001, and both are incorporated by reference herein.

A control system, such as the Ingenio® system from Tokyo Electron Limited, can comprise management applications, such as a recipe management application. For example, the recipe management application can be used to view and/or control a recipe stored in the Ingenio® system database that is synchronized with equipment via a network environment from the Ingenio® system. An Ingenio client can be placed separately at a distance from the factory, and can provide comprehensive management functions to multiple equipment units.

Recipes can be organized in a tree structure that can comprise recipe sets, classes, and recipes that can be displayed as objects. Recipes can include process recipe data, system recipe data, and IMM recipe data. Data can be stored and organized using a recipe set. The IMM recipes that are on the processing tool 110 can be used to determine wafer sampling and a relationship between slots and IM recipes. IM recipes can exist on IMM 140, can be selected in Telius® IMM recipes, can contain pattern recognition information, can be used to identify the chips to sample on each wafer, and can be used to determine which PAS recipe to use. PAS recipes can be used to determine which ODP library to use, and to define the measurement metrics to report, such as top CD, bottom CD, side wall angle (SWA), layer thicknesses, trench width, and goodness of fit (GOF).

A control system, such as the Ingenio® system, can include APC applications that can operate as control strategies, and a control strategy can be associated with a control plan that can include an etching tool recipe. Wafer level context matching at runtime allows for custom configuration by wafer (slot, waferID, lotID, etc.). A control strategy can include one or more control plans, and a process module and/or measurement module that is being controlled has at least one control plan defined for a visit to the process module and/or measurement module. Control plans can contain maps, models, control limits, targets, and can include static recipes, formula models, and feedback plans.

In the control system, feed forward and/or feedback control can be implemented by configuring Control Strategies, Control Plans, and Control Models. A Control Strategy can be written for each system process where feed forward and/or feedback control is implemented. When a strategy is protected, all of its child objects (plans and models) cannot be edited. When a system recipe executes, one or more of the Control Plans within the Control Strategy can be executed. Each control plan can be used to modify the recipe based on feed-forward and/or feed-back information.

A control strategy can be used to establish a processing recipe and processing tool; to determine control plans; to determine wafer maps, to establish an action in response to a failure; to establish context; to establish a control type (standard, simulated or test); to establish a control action (enabled/disabled); and to establish a control state (protected/unprotected).

Control strategies can comprise standard control strategies and simulation control strategies. The standard control strategies can be configured to control the process tool 110. A simulation control strategy can be associated with simulation control plan(s). Based on the model selected, the control plan will tune the recipe variables. The recipe variables can be logged by the controller but not sent to process tool. Multiple simulation control strategies can be executed simultaneously, but only one standard type of control plan will be executed for a given wafer.

Furthermore, a control strategy can include other fields that may be manipulated. For example, the LotID(s) field can be used to enter/edit the lot identifiers; the CJID(s) field can be used to enter/edit the control job identifiers. The PJID(s) field can be used to enter/edit the process job identifiers. The Cassette ID(s) field can be used to enter/edit the cassette identifiers. The Carrier ID(s) field can be used to enter/edit the carrier identifiers. The Slot(s) field can be used to enter/edit the slot numbers. The Wafer Type(s) field can be used to enter/edit the wafer types. The Scribed Wafer ID(s) field can be used to enter/edit the scribed wafer identifiers. The Wafer ID(s) field can be used to enter/edit the wafer identifiers. The Start Time earlier than field can be used to enter/edit the start time. In addition, the Start Time later than field can be used to enter/edit the end time.

Control plans can cover multiple process steps within a module, and can be controlled by the factory. Parameter ranges can be defined for each process and/or measurement module, and variable parameter "Limit Ranges" are provided for each control parameter.

The control system can include APC applications that can be used to analyze the collected data, and establish error conditions. An analysis application can be executed when a context is matched. During the execution of an analysis application, one or more analysis plans can be executed. For example, univariate SPC models/plans may be executed, and may trigger SPC alarms; PCA and/or PLS models/plans may be executed, and may trigger SPC alarms; multivariate SPC models/plans may be executed, and may trigger SPC alarms; and other file output plans may be executed, and may trigger software alarms.

A plan can create an error when a data failure occurs, an execution problem occurs, or a control problem occurs. When an error occurs, the plan can generate an alarm message; the parent strategy status can be changed to a failed status; the plan status can be changed to a failed status; and one or more messages can be sent to the alarm log and the FDC system.

When a feed forward plan or a feedback plan fails, one or more of the plans in the parent strategy may be terminated, and their status can be changed to a failed status. In one case, when a bad incoming wafer is detected, a control plan can detect and/or identify this as a faulty incoming wafer. In addition, when a feedback plan is enabled, the feedback plan can skip a wafer that has been identified to be defective and/or faulty by another plan. A data collection plan can reject the data at all the measurement sites for this wafer or reject the data because a map created using the data fails to meet uniformity limits.

In one embodiment, feedback plan failure may not terminate the strategy or other plans, and a map generation failure may also not terminate the strategy or other plans. Successful plans, strategies and/or map generations do not create any error/alarm messages.

The control system can include an FDC system that includes applications for managing error/alarm/fault conditions. When an error, alarm, and/or fault condition is detected, an FDC application in the FDC system can send a message to one or more processing modules and/or tools. For example, a message can be sent to pause the current process or to stop the current process. In one case, a tool pause/stop can be done by changing the value of the maintenance counter.

Pre-specified failure actions for strategy and/or plan errors can be stored in a database, and can be retrieved from the database when an error occurs. Failure actions can include using the nominal process recipe for this wafer and module; using a null process recipe for this wafer and module; pausing the process module and waiting for intervention; or pausing the whole tool and waiting for intervention. For example, a processing tool may take action only when the wafer with the error reaches the target process module where the R2R failure occurred, and the processing tool may be able to continue processing other lots, recipes, or wafers in other modules. A null recipe can be a control recipe that is used by a processing tool and/or processing system to allow a wafer to pass through a processing chamber without processing. For example, a null recipe can be used when a processing tool is paused or when a wafer does not require processing.

The FDC system can detect faults, predict tool performance, predict preventative maintenance schedules, decrease maintenance downtime, and extend the service life of consumable parts in the processing tool. The FDC system collects data from the tool and additional sensors, calculates summary parameters, performs MVAs, and compares the results with normal operation using SPC. For example, the SPC component can perform a series of Western Electric run-rule evaluations, and generates an SPC alarm if a run-rule is violated.

The operations of the APC system and the FDC system can be configured by the customer and can be based on the context of the wafers being processed. Context information includes recipe, lot, slot, control job, and process job. The user interfaces for APC system and the FDC system are web-enabled, and provide a near real time tool status and a real time alarm status display.

Figure 3:
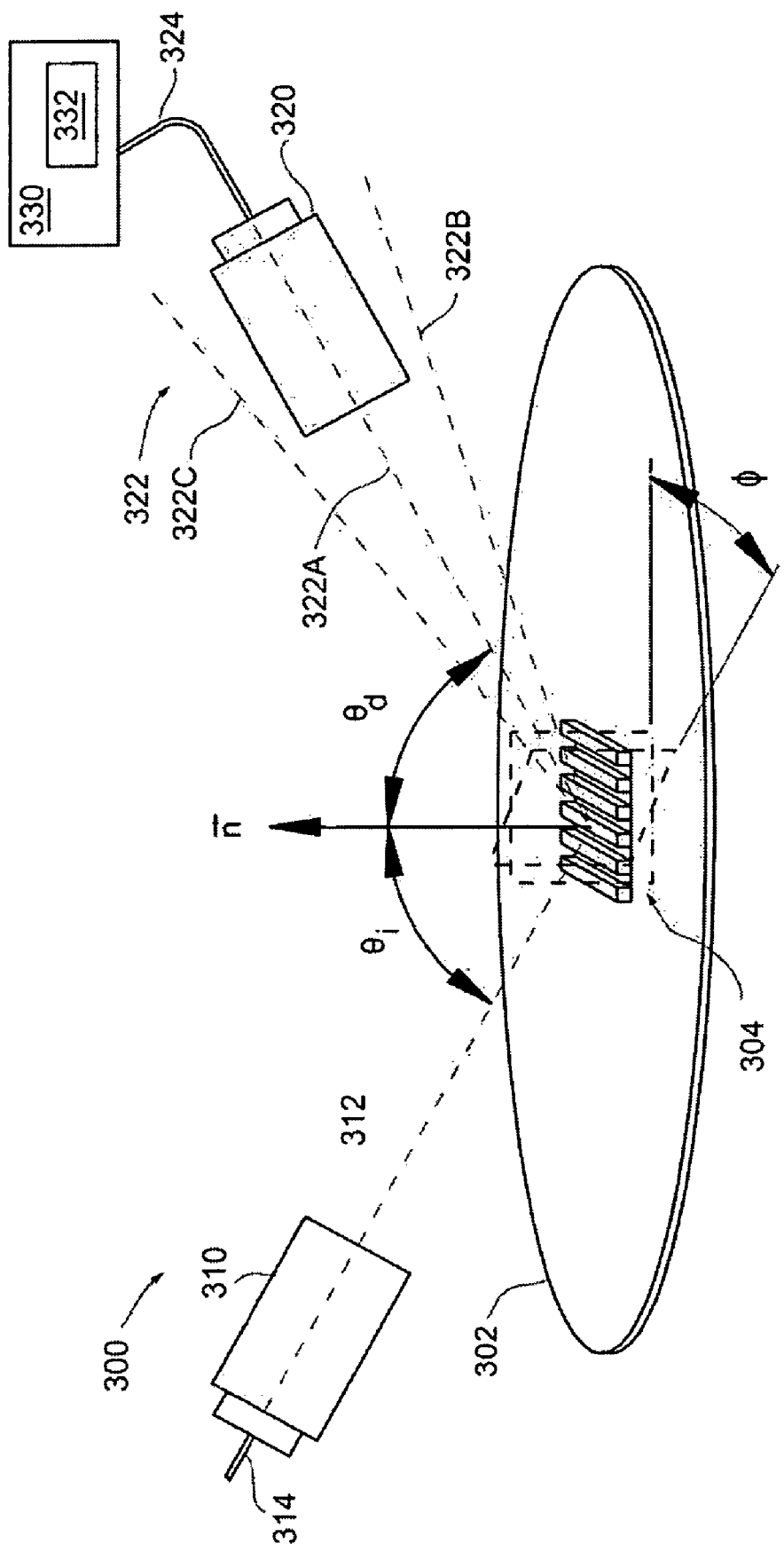
FIG. 3 shows an exemplary view of an optical metrology system in accordance with an embodiment of the invention.

FIG. 3 shows an exemplary view of an optical metrology system in accordance with an embodiment of the invention. In the illustrated embodiment, an optical metrology system 300 is shown that can be configured to examine periodic grating 304 to obtain overlay measurements. In addition, optical metrology system 300 can include an electromagnetic source 310. Periodic grating 304 is illuminated by an incident signal 312 from electromagnetic source 310. Electromagnetic source 310 can include focusing optics to control the spot size of incident signal 312.

In one embodiment, the spot size of incident signal 312 can be reduced to less than the size of the test area on wafer 302 that contains periodic grating 304. For example, a spot size of about 50 micrometers by 50 micrometers, or smaller, can be used. Additionally, electromagnetic source 310 can include a pattern recognition module to center the spot in the test area on wafer 302. Furthermore, electromagnetic source 310 can include a polarizing element such as a polarizer (not shown).

As shown in FIG. 3, incident signal 312 is directed onto periodic grating 304 at an incidence angle $\theta_i$ with respect to normal $\vec{n}$ of periodic grating 304, and an azimuthal angle $\Phi$ (i.e., the angle between the plane of incidence signal 312 and the direction of the periodicity of periodic grating 304).

As shown in FIG. 3, diffraction signal 322 leaves at an angle of $\theta_d$ with respect to normal $\vec{n}$. In addition, diffraction signal 322 includes a plurality of diffraction orders. For the sake of illustration and clarity, FIG. 3 illustrates diffraction signal 322 having a zero-order diffraction (diffraction signal 322A), a positive first-order diffraction (diffraction signal 322B), and a negative first-order diffraction (diffraction signal 322C). It should be recognized, however, that diffraction signal 322 can include any number of diffraction orders.

Diffraction signal 322 is received by detector 320 and analyzed by signal-processing system 330. When optical metrology system 300 includes an ellipsometer, the amplitude ratio tan $\Psi$ and the phase $\Delta$ of diffraction signal 322 is received and detected. When optical metrology system 300 includes a reflectometer, the relative intensity of diffraction signal 322 is received and detected. Additionally, detector 320 may include a polarizing element (not shown) such as an analyzer.

In one exemplary embodiment, periodic grating 304 is illuminated obliquely and conically, meaning that incidence angle $\theta_i$ is not equal to zero degrees and the azimuthal angle $\Phi$ is not equal to zero degrees. Zero-order cross polarization measurements can be obtained, and then overlay measurements can be obtained based on the zero-order cross polarization measurements.

For example, one or more times while the wafer 302 is being fabricated, one or more periodic gratings 304 can be examined to obtain metrology measurements. As described above, source 310 directs an oblique and conical incident signal at periodic grating 104. Detector 320 receives the zero-order diffraction signal 322A. The zero-order cross polarization measurements can be obtained, and the signal-processing system 330 can then determine the feature parameters based on the obtained measurements. In some instances, zero-order cross polarization measurements can be obtained from a single location/site on periodic grating 304, and the signal-processing system 330 can provide some metrology data without having to move wafer 302, which has the advantage of increasing throughput. Zero-order light refers to the light reflected at an angle equal to the incident angle. Furthermore, the signal-processing system 330 can compute a difference between the zero-order cross polarization measurements and use the computed difference to provide additional metrology data. Signal-processing system 330 can include any convenient computer system configured to process zero-order cross polarization measurements.

Optical measurement systems and techniques are taught in U.S. Pat. No. 6,947,141, entitled OVERLAY MEASUREMENTS USING ZERO-ORDER CROSS POLARIZATION MEASUREMENTS, filed on Sep. 8, 2004, U.S. Pat. No. 6,928,395, entitled METHOD AND SYSTEM FOR DYNAMIC LEARNING THROUGH A REGRESSION-BASED LIBRARY GENERATION PROCESS, filed on May 27, 2004, and U.S. Pat. No. 6,839,145, entitled OPTICAL PROFILOMETRY OF ADDITIONAL-MATERIAL DEVIATIONS IN A PERIODIC GRATING, filed on May 5, 2003 and all of which are assigned to Timbre Technologies, Inc a TEL company and all are incorporated by reference herein.

The controller 120 can use equation-based techniques, formula-based techniques, and table-based techniques in different processing regimes. When the controller 120 uses these techniques, the feed-forward and/or feedback control variables can be configurable.

The controller 120 can operate as a single input single output (SISO) device, as a single input multiple output (SIMO) device, as a multiple input single output (MISO) device, and/or as a multiple input multiple output (MIMO) device, among other variants. In addition, inputs and outputs can be within one controller 120 and/or between one or more controllers 120. In a multi-process case including multiple modules, map information can be fed-forward or fed-back from one controller to another controller.

When a processing tool and/or process module sends data to the database, this data can be accessed by the controller 120. For example, this data can comprise tool trace data, maintenance data, and End Point Detection (EPD) data. The trace data can provide important information about the process. The trace data can be updated and stored during processing or after the processing of a wafer is completed.

The controller 120 can receive and utilize externally provided data for process parameter limits in a process module. For example, the controller GUI component provides a means for the manual input of the process parameter limits. In addition, a factory level controller can provide limits for process parameters for each process module.

The controller 120 can receive and execute models created by commercially available modeling software. For example, the controller 120 can receive and execute models (PLA, PCA, etc.) that were created by external applications and sent to the controller 120.

Map and/or model updates can be performed by running monitor wafers, varying the process settings and observing the results, then updating the map and/or model. For example an update can take place every N processing hours by measuring the before and after characteristics of a monitor wafer. By changing the settings over time to check different operating regions one could validate the complete operating space over time, or run several monitor wafers at once with different recipe settings. The update procedure can take place within the controller 120 at the tool or at the factory, allowing the factory control to manage the monitor wafers and model updates.

The controller 120 can compute an updated recipe and/or updated map for the next wafer. In one case, the controller 120 can use the feed-forward information, modeling information, and the feedback information to determine whether or not to change the current recipe before running the current wafer, before running the next wafer, or before running the next lot.

When a metrology data source is being used to provide process result data, a route sequence can be specified which causes a wafer to be routed to the IMM 140 at the correct point in the process. For example, a wafer can be routed to the IMM 140 before entering a processing module 115 and/or after the wafer has been processed in a processing module 115. In addition, an IM recipe can be specified which causes a set of pre-determined measurements to be made and a pre-determined set of output data to be provided. For example, the data can be filtered before the data is averaged and used by the controller 120.

The controller 120 can comprise one or more filters (not shown) to filter the metrology data in order to remove the random noise. An outlier filter can be used to remove outliers that are statically not valid and should not be considered in the calculation of the mean of a wafer measurement. A noise filter can be used to remove random noise and stabilize the control loop, an Exponentially Weighed Moving Average (EWMA) or Kalman filter can be applied.

The controller 120 can receive and utilize feedback data. For example, the controller 120 can receive map information for wafers that has already been processed and adjust the process model based on this data.

The controller 120 can send and receive notification of an error condition. For example, the controller 120 can send and receive notifications to and from a factory level controller, a R2R controller, and/or a tool level controller, among other devices. In addition, a notification can be sent via the e-Diagnostics network, e-mail, or pager after the identification of an error condition.

The controller 120 can calculate and/or run process maps and/or models in a simulated mode. For example, the controller 120 can operate in simulation mode in parallel with the actual process mode. In this case, the simulated actions can be recorded in the historical database, and immediate action is not taken.

The controller 120 can select process maps and/or models based on incoming material context. For example, the controller 120 can select process maps and/or models based on the incoming material state and process recipe. The controller can comprise means to verify that the system 100 can calculate a valid R2R setting.

The controller 120 inputs can include time constants for feedforward/feed-back loops, a reset event for accumulation, an IMM step, and ODP offset, among others. Instructions can include, inter alia, targets, tolerances, computational commands, data collection plans, algorithms, models, coefficients, and recipes. The Wafer State can include information, for example, from the wafer being processed (site, wafer, lot, batch state), profiles, and characteristics measured physically or electrically. The Module Physical State can include the current or last known recorded state of the module and components that will be used to process the wafer—RF hours, number of wafers, consumable states. The Process State can include the current or last known measured state from sensors of the processing environment, including trace data, and summary statistics. The Controller Parameters can include the last settings for the recipe/controller set points and process targets that created the wafer state, module physical state, and process state.

The controller 120 can comprise at least one computer and software that supports operational software, such as the Ingenio® software. In one case, the operational software can include a configuration module, a data management module, a GUI module, a fault management module, or a troubleshooting module, or any combination of two or more thereof. Also, configuration GUI screens can be used to configure the interface between the computer and the processing element, to determine the device type for the processing element (i.e., tool, module, sensor, etc.). Data management GUI screens can be used to determine the amount and type of data to collect and to determine how to and where to store the collected data. Furthermore, fault management GUI screens can be used to inform a user about fault conditions.

In general, feed-forward control is the updating of a process module recipe using pre-process data measured on the wafer prior to its arrival in the process module. In one case, metrology data and process target data are received by the controller 120. These values can be compared, and the result is the desired process result (for example, the desired trim amount). Then, this desired process result can be sent to the controller for model selection and calculation of the appropriate process recipe parameters. This new recipe is sent to the process module and the wafer is processed (trimmed) using the new recipe.

In the system 100, feed-forward control can be implemented, in the controller 120, by configuring Control Strategies, Control Plans, and Control Models. A Control Strategy can be written for each system recipe where feed-forward control is implemented. When this system recipe executes in the processing tool 110, the Control Plans within the Control Strategy can be executed. Each control plan can be used to modify the recipe based on feed-forward information.

A control plan can include input data sources. A different number of input data sources can be used, and each input data source can have a different symbol value. For example, one data source can be an ODP tool, and it can be part of the processing tool, such as a Telius®. In addition, another data source can be a SEM, and the Parameter/Value can be actual measured data such as a CD-SEM data.

Using inputs from these data sources, a user can specify a calculation for the target calculation. The result of this calculation is then used to choose which control model to execute. The system starts with the Nominal Recipe (the recipe as it exists on the tool). Then, the updates from each executed Control Plan are added. Once all the Control Plans are executed (within the matching Control Strategy), the final recipe is sent to the tool.

The controller 120 can operate as a recipe parameter solver that produces recipe parameters according to appropriate process model, process model constraints, process targets, and process parameter constraints. The controller 120 has the capability of managing multiple process models that are executed at the same time and are subject to a single set of process recipe constraints. If control failure occurs, the controller 120 can be configured to use the tool process recipe (nominal recipe), use the null recipe, or to stop Run-to-Run control (according to tool parameter settings). To pause the tool 110, the controller 120 can be configured to pause the process module, or to pause the entire system 100.

The processing system 100 can be used to process wafers and control strategies can be used to define the process sequence.

When an Isolated Critical Dimension (Iso-CD) value is greater than or equal to the Nested-CD value, an Iso-Greater Control Strategy and the associated control plans can be executed. The control plans can include at least one of an Iso/nested control plan for controlling an iso/nested process, a Trim Control plan for controlling a trimming process, and a Bottom Anti-Reflective Coating (BARC) open control plan for controlling a BARC etching process. When the Iso-CD value is equal to the Nested-CD value, or when the required trim amount is substantially equal to zero, or when BARC etching is not required, a null recipe can be sent to the processing tool. Alternately, a recipe may not be sent to the processing tool.

The iso/nested process can include an etching process when the Iso-CD value is greater than the Nested-CD value. For example, an iso/nested etching process can be run using a chamber pressure approximately equal to 10 mT, an upper RF power approximately equal to 200 W, an lower RF power approximately equal to 0 W; an $O_2$ flow rate approximately equal to 70 sccm, the back side He pressure can be approximately equal to 3 Torr in the center region, the back side He pressure can be approximately equal to 3 Torr in the edge region, the top plate temperature can be approximately equal to 80° C., the chamber wall temperature can be approximately equal to 60° C., the wafer holder temperature can be approximately equal to 30° C., and the processing time can be approximately equal to 36 sec. In addition, the CD change for a nested feature was measured to be approximately equal to −23 nm, and the CD change for isolated feature was measured to be approximately equal to −33 nm.

Figure 4A:
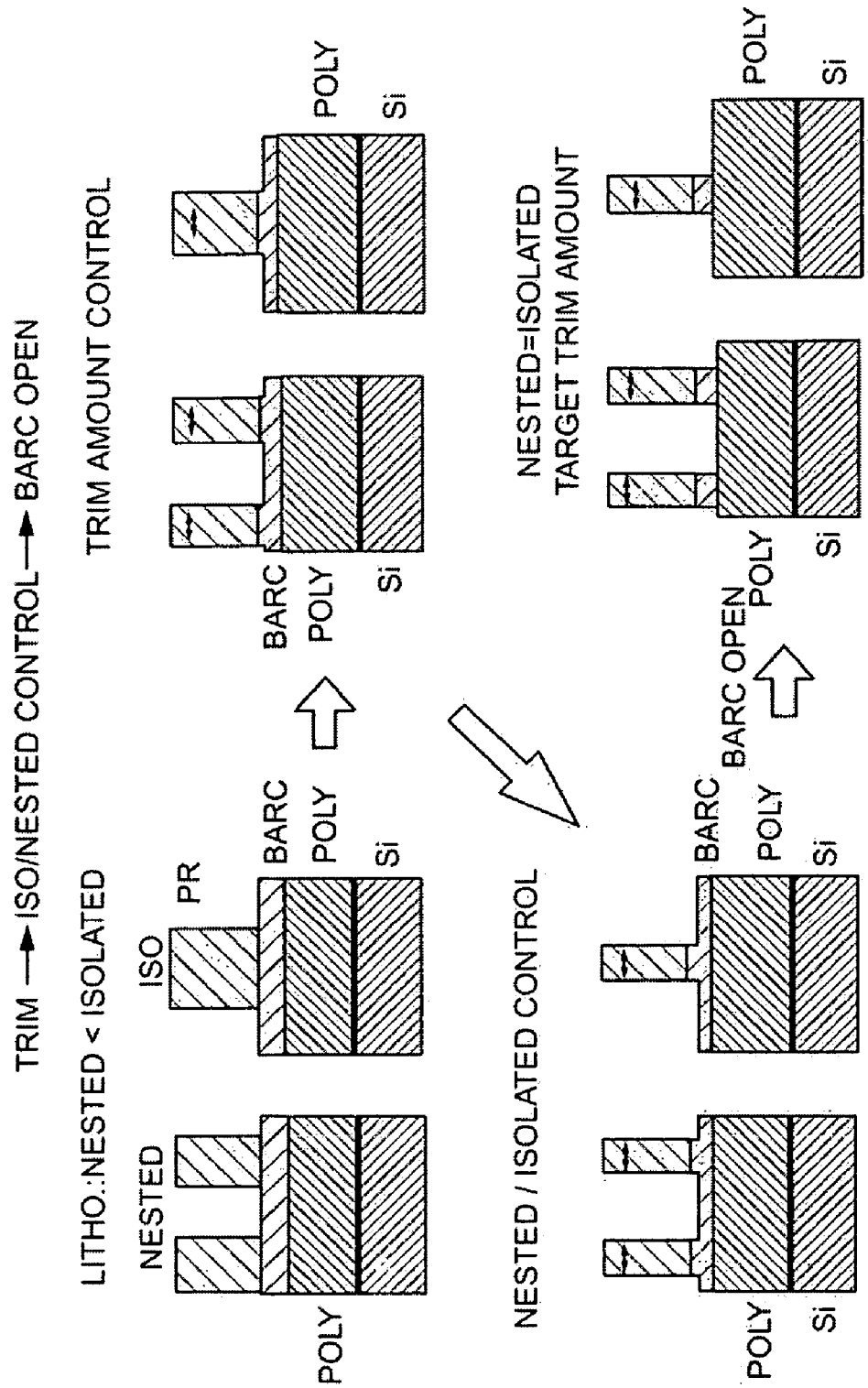
FIG. 4A-4D illustrate exemplary trimming procedures in accordance with embodiments of the invention.

In a first trimming procedure shown in FIG. 4A, the isolated soft mask (photoresist) feature size can be larger than the nested soft mask (photoresist) feature size, and a first Iso-Greater Control Strategy requires that the trim process be executed first, the iso/nested etching process be executed second, and the BARC open etching process be executed last.

A trim process can be performed first in which substantially the same amount is trimmed (laterally etched) from the isolated soft mask features and the nested soft mask features. After the trim process is performed, the isolated soft mask feature size remains larger than the nested soft mask feature size. During a trim process, a hard mask (BARC) layer can be partially etched.

Next, an iso/nested etching process can be performed in which unequal amounts are trimmed (laterally etched) from the isolated soft mask features and the nested soft mask features. After the iso/nested etching process is performed, the isolated soft mask features are substantially the same size as the nested soft mask features. During an iso/nested etching process, a hard mask (BARC) layer can be partially etched.

Finally, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed. After the BARC open etching process is performed, the size of the isolated hard mask features and the nested hard mask features is substantially equal to the required CD.

Figure 4B:
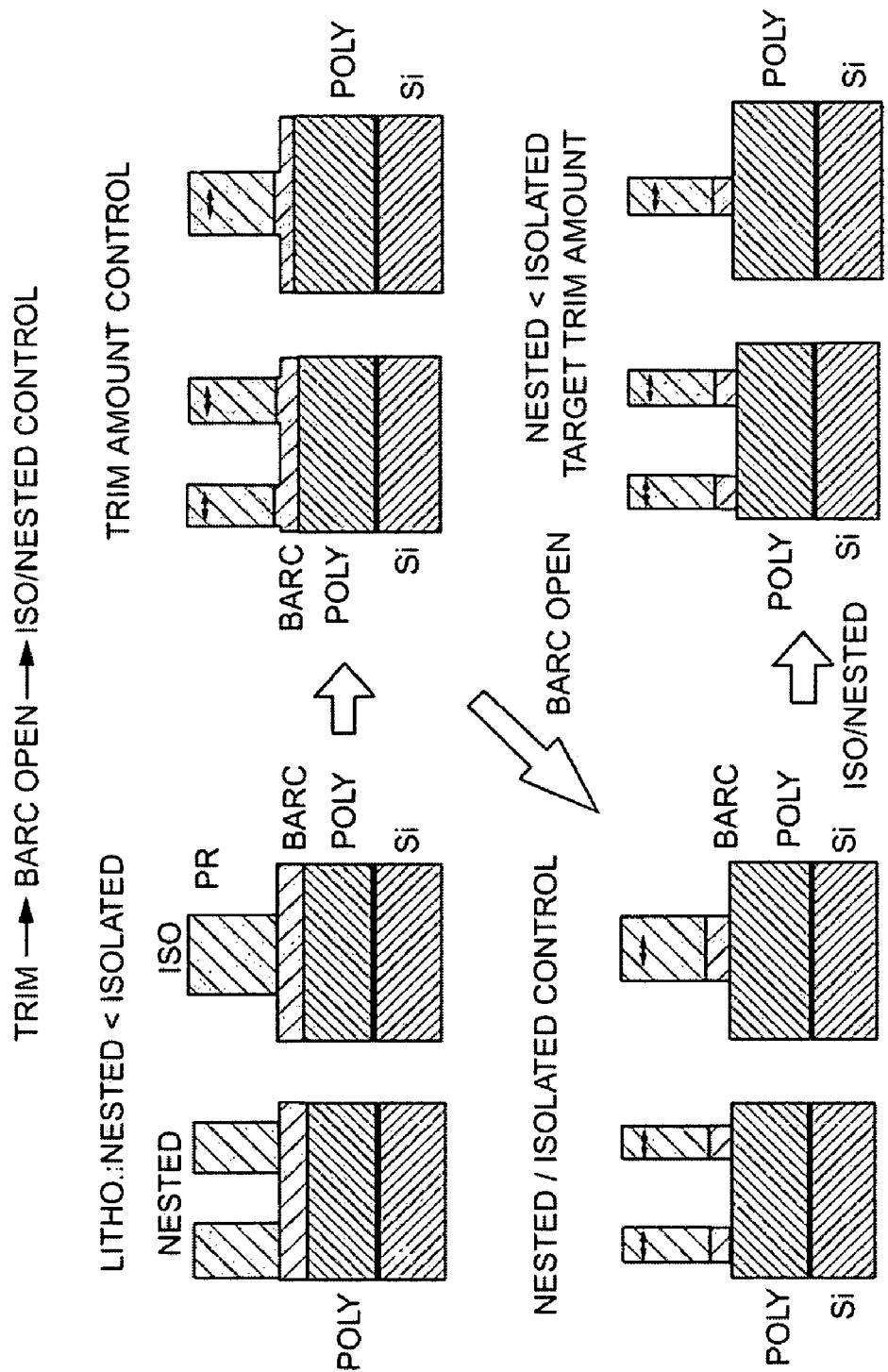

In a second trimming procedure shown in FIG. 4B, the isolated soft mask (photoresist) feature size can be larger than the nested soft mask (photoresist) feature size, and the second Iso-Greater Control Strategy requires that the trim process be executed first, the BARC open etching process be executed second, and the iso/nested etching process be executed last.

A trim process can be performed first in which substantially the same amount is trimmed (laterally etched) from the isolated soft mask features and the nested soft mask features. After the trim process is performed, the isolated soft mask feature size remains larger than the nested soft mask feature size. During a trim process, a hard mask (BARC) layer can be partially etched.

Next, a BARC open etching process can be performed in which the remaining BARC is removed forming isolated hard mask features and nested hard mask features. After the BARC open etching process is performed, the isolated soft mask features remain larger in size than the nested soft mask features. In addition, the hard mask features are substantially the same size as the soft mask features after the BARC open etching process is performed.

Finally, an iso/nested etching process can be performed in which unequal amounts are trimmed (laterally etched) from the isolated soft mask features and the nested soft mask features. In addition, during an iso/nested etching process, unequal amounts are trimmed from the isolated hard mask features and the nested hard mask features. After the iso/nested etching process is performed, the isolated soft mask features are substantially the same size as the nested soft mask features. During an iso/nested etching process, a hard mask (BARC) layer can be partially etched. After the iso/nested etching process is performed, the size of the isolated hard mask features and the nested hard mask features is substantially equal to the required CD.

Figure 4C:
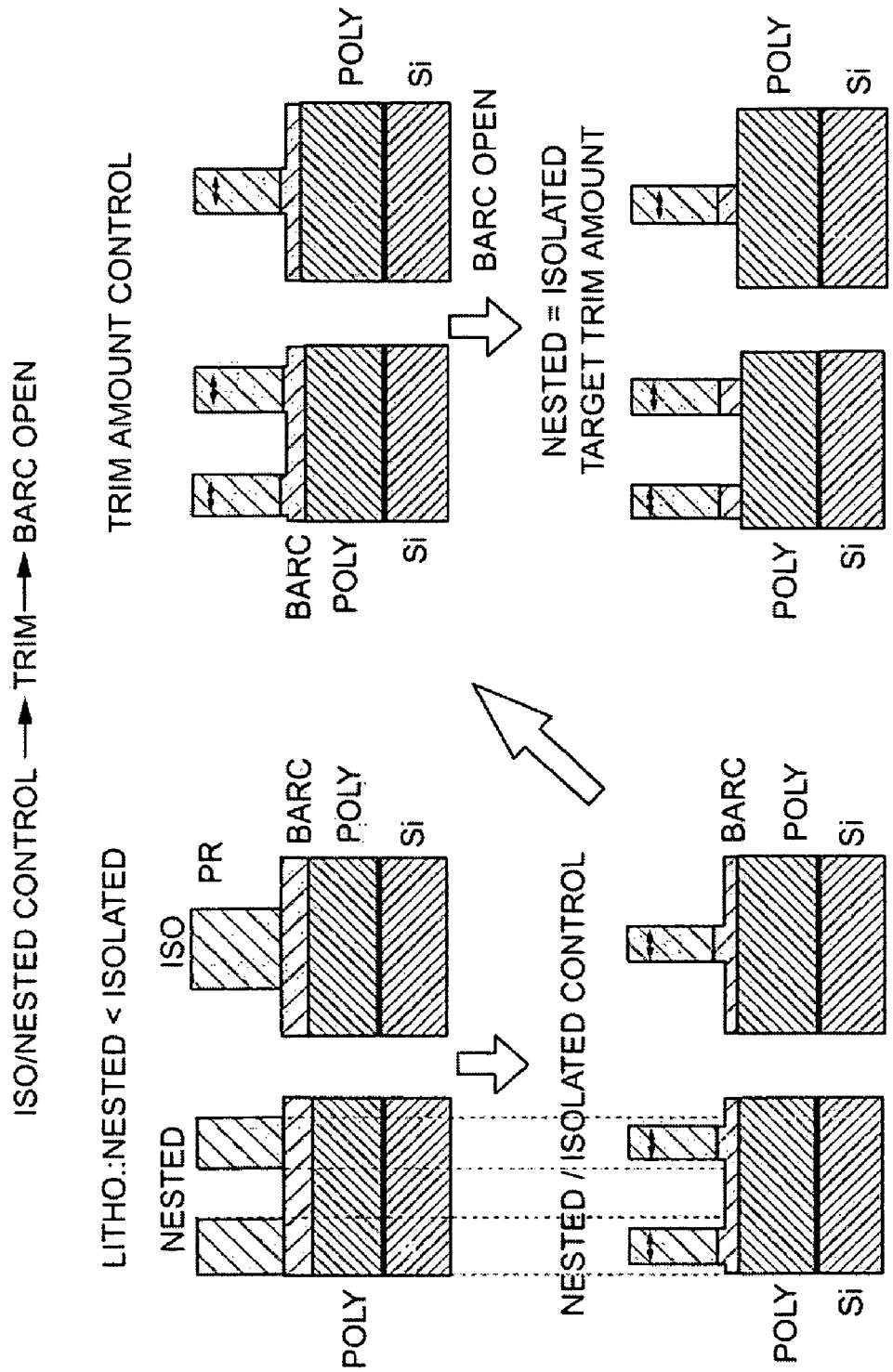

In a third trimming procedure shown in FIG. 4C, the isolated soft mask (photoresist) feature size can be larger than the nested soft mask (photoresist) feature size, and a third Iso-Greater Control Strategy can require that the iso/nested etching process be executed first, the trim process be executed second, and the BARC open etching process be executed last.

An iso/nested etching process can be performed first in which unequal amounts are trimmed (laterally etched) from the isolated soft mask features and the nested soft mask features. After the iso/nested etching process is performed, the isolated soft mask features are substantially the same size as the nested soft mask features. During an iso/nested etching process, a hard mask (BARC) layer can be partially etched.

Next, a trim process can be performed in which substantially the same amount is trimmed (laterally etched) from the isolated soft mask features and the nested soft mask features. After the trim process is performed, the size of the isolated soft mask features remains substantially the same as the size of the nested soft mask features. During a trim process, a hard mask (BARC) layer can be partially etched.

Finally, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed. After the BARC open etching process is performed, the size of the isolated hard mask features and the nested hard mask features is substantially equal to the required CD.

Figure 4D:
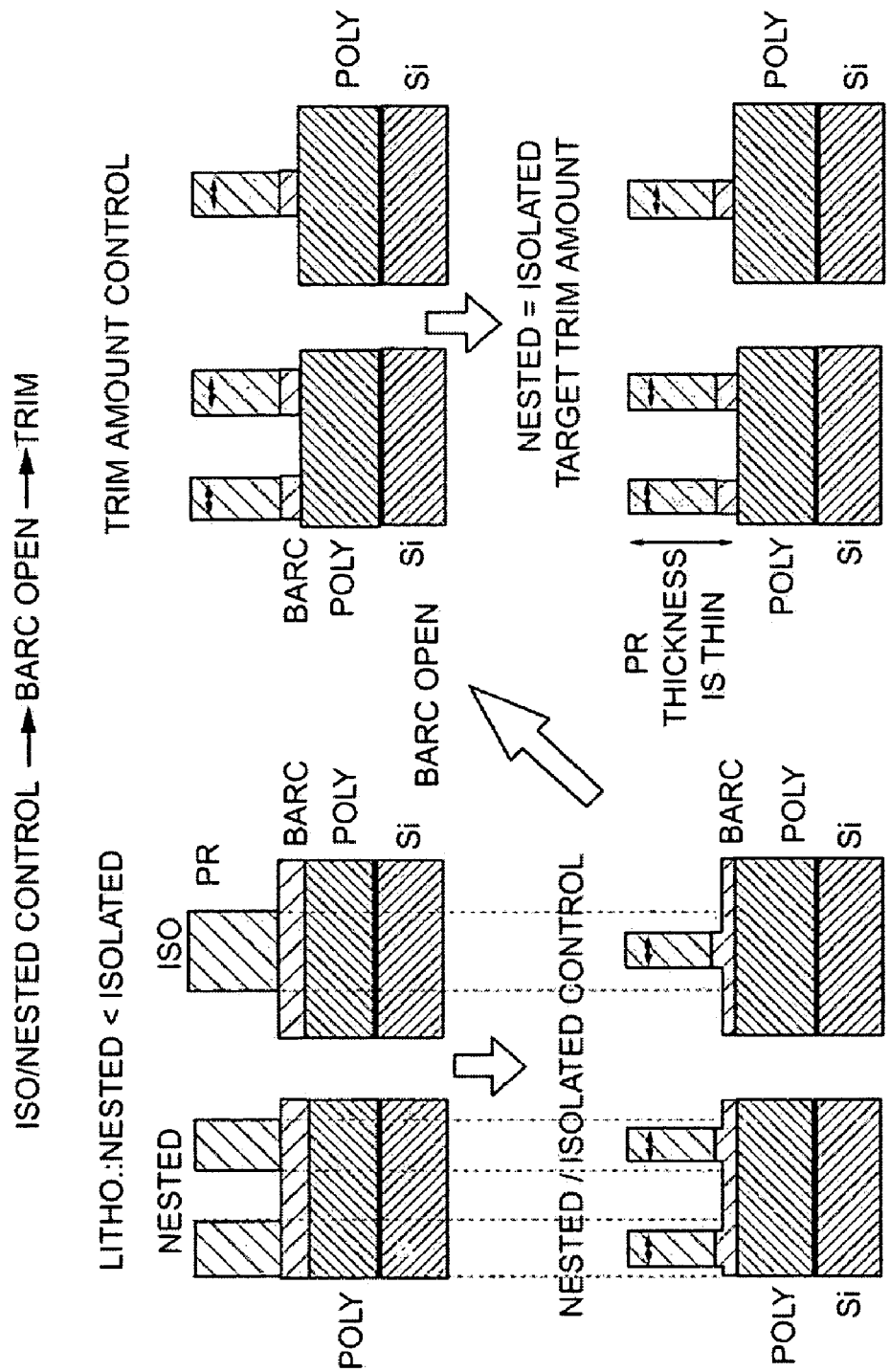

In a fourth trimming procedure shown in FIG. 4D, the isolated soft mask (photoresist) feature size can be larger than the nested soft mask (photoresist) feature size, and a fourth Iso-Greater Control Strategy can require that the iso/nested etching process be executed first, the BARC open etching process be executed second, and the trim process be executed last.

An iso/nested etching process can be performed first in which unequal amounts are trimmed (laterally etched) from the isolated soft mask features and the nested soft mask features. After the iso/nested etching process is performed, the isolated soft mask features are substantially the same size as the nested soft mask features. During an iso/nested etching process, a hard mask (BARC) layer can be partially etched.

Next, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed.

Finally, a trim process can be performed in which substantially the same amount is trimmed (laterally etched) from the isolated soft mask features and the nested soft mask features. In addition, during the trim process, substantially the same amount is trimmed from the isolated hard mask features and the nested hard mask features. After the trim process is performed, the size of the isolated hard mask features and the nested hard mask features is substantially equal to the required CD. After the trim process, the size of the soft mask features can be equal to or less than the size of the hard mask features.

During a trimming procedure, data collection (DC) plans associated with the Iso-Greater Control Strategy can be executed. Data collection plan applications can run before, during, and/or after control plans are executed. Data collection plans can obtain data from processing elements such as a tool, a module, a chamber, and a sensor; measuring elements such as a OES system, ODP system, a SEM system, a TEM system, and a MES system.

In addition, the data collection plan selection and initiation can also be context-based. DC plans can be used to provide data for mapping application that are associated with the Iso-Greater Control Strategy. The DC plan determines which data is collected, how the data is collected, and where the data is stored. The controller can auto-generate data collection plans for physical modules. Typically, one data collection plan can be active at a time for a specific module, and the controller can select and use a data collection plan that matches the wafer context. Data can include trace data, process log information, recipe data, maintenance counter data, ODP data, OES data, voltage/current (VI) probe (VIP) data, or analog data, or a combination of two or more thereof. Measurement devices and/or sensors can be started and stopped by a DC plan. A DC plan can also provide information for trimming data, clipping data, and dealing with spike data and outliers.

For wafers having Iso-CD values that are less than the Nested-CD values, a Nes-Greater Control Strategy and it associated plans can be executed. The control plans can include at least one of an Iso/nested control plan for controlling an iso/nested etching process, a Trim Control plan for controlling a trimming process, and a BARC open control plan for controlling a BARC etching process.

The iso/nested process can include a deposition process when the Nested-CD value is greater than the Iso-CD value. For example, an iso/nested deposition process can be run using a chamber pressure approximately equal to 10 mT, an upper RF power approximately equal to 200 W, an lower RF power approximately equal to 100 W; a $CHF_3$ flow rate approximately equal to 200 sccm, the back side He pressure can be approximately equal to 3 Torr in the center region, the back side He pressure can be approximately equal to 3 Torr in the edge region, the top plate temperature can be approximately equal to 80° C., the chamber wall temperature can be approximately equal to 60° C., the wafer holder temperature can be approximately equal to 30° C., and the processing time can be approximately equal to 185 sec. In addition, the CD change for a nested feature was measured to be approximately equal to +15 nm, and the CD change for isolated feature was measured to be approximately equal to +30 nm.

Figure 5A:
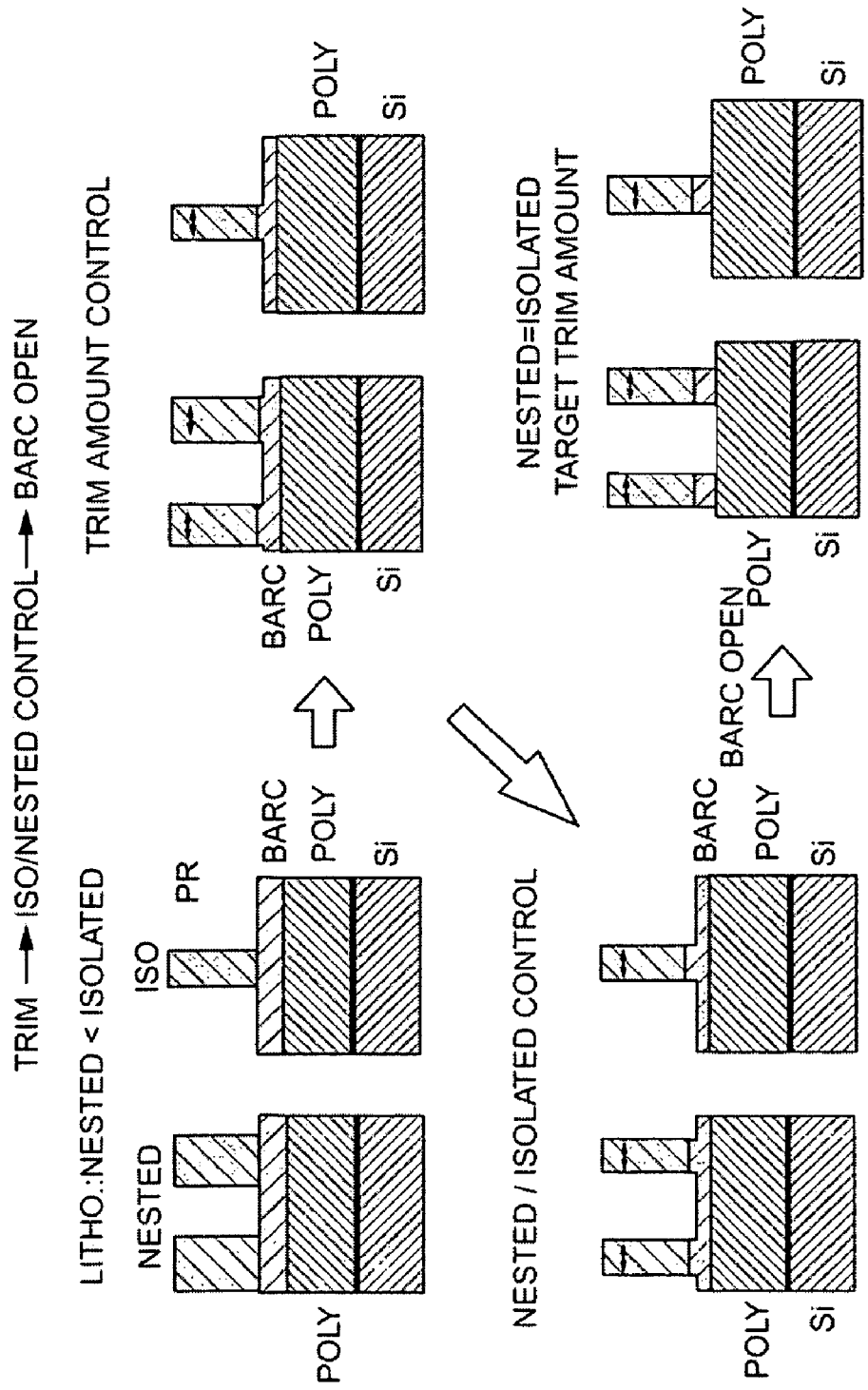
FIGS. 5A-5D illustrate exemplary trimming procedures in accordance with embodiments of the invention.

In a fifth trimming procedure shown in FIG. 5A, the nested soft mask (photoresist) feature size can be greater than the isolated soft mask (photoresist) feature size, and a first Nes-Greater Control Strategy requires that the trim process be executed first, an iso/nested deposition process be executed second, and the BARC open etching process be executed last.

A trim process can be performed first in which substantially the same amount is trimmed (laterally etched) from the isolated soft mask features and the nested soft mask features. After the trim process is performed, the nested soft mask feature size remains larger than the isolated soft mask feature size. During a trim process, a hard mask (BARC) layer can be partially etched.

Next, an iso/nested deposition process can be performed in which unequal amounts are deposited to the isolated soft mask features and the nested soft mask features. During the iso/nested deposition process, the deposition rate can be larger on the isolated features and after the deposition process is performed the isolated soft mask (photoresist) feature size can be greater than or substantially equal to the nested soft mask (photoresist) feature size. During an iso/nested deposition process, a hard mask (BARC) layer can be partially coated.

Finally, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed. After the BARC open etching process is performed, the size of the isolated hard mask features and the nested hard mask features is substantially equal to the required CD.

Figure 5B:
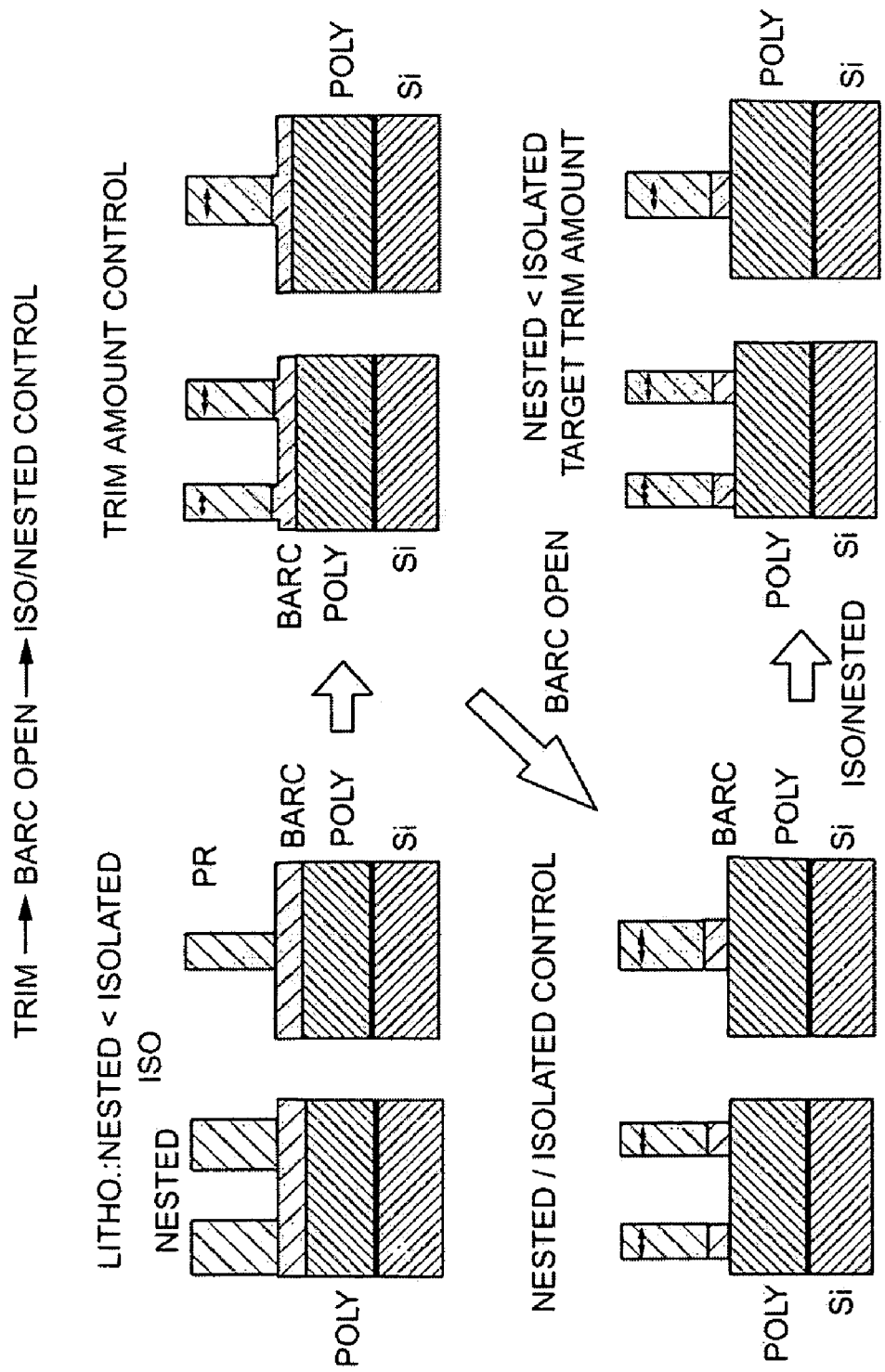

In a sixth trimming procedure shown in FIG. 5B, the nested soft mask (photoresist) feature size can be greater than the isolated soft mask (photoresist) feature size, and a second Nes-Greater Control Strategy requires that the trim process be executed first, the BARC open etching process be executed second, and the iso/nested deposition process be executed last.

A trim process can be performed first in which substantially the same amount is trimmed (laterally etched) from the isolated soft mask features and the nested soft mask features. After the trim process is performed, the nested soft mask feature size remains larger than the isolated soft mask feature size. During a trim process, a hard mask (BARC) layer can be partially etched.

Next, a BARC open etching process can be performed in which the remaining BARC is removed forming isolated hard mask features and nested hard mask features. After the BARC open etching process is performed, the nested soft mask features remain larger in size than the isolated soft mask features. In addition, the hard mask features are substantially the same size as the soft mask features after the BARC open etching process is performed.

Finally, an iso/nested deposition process can be performed in which unequal amounts are deposited to the isolated soft mask features and the nested soft mask features. During the iso/nested deposition process, the deposition rate can be larger on the isolated features and after the deposition process is performed, the isolated soft mask (photoresist) feature size can be greater than or substantially equal to the nested soft mask (photoresist) feature size. During an iso/nested deposition process, a hard mask (BARC) layer can be partially coated.

Figure 5C:
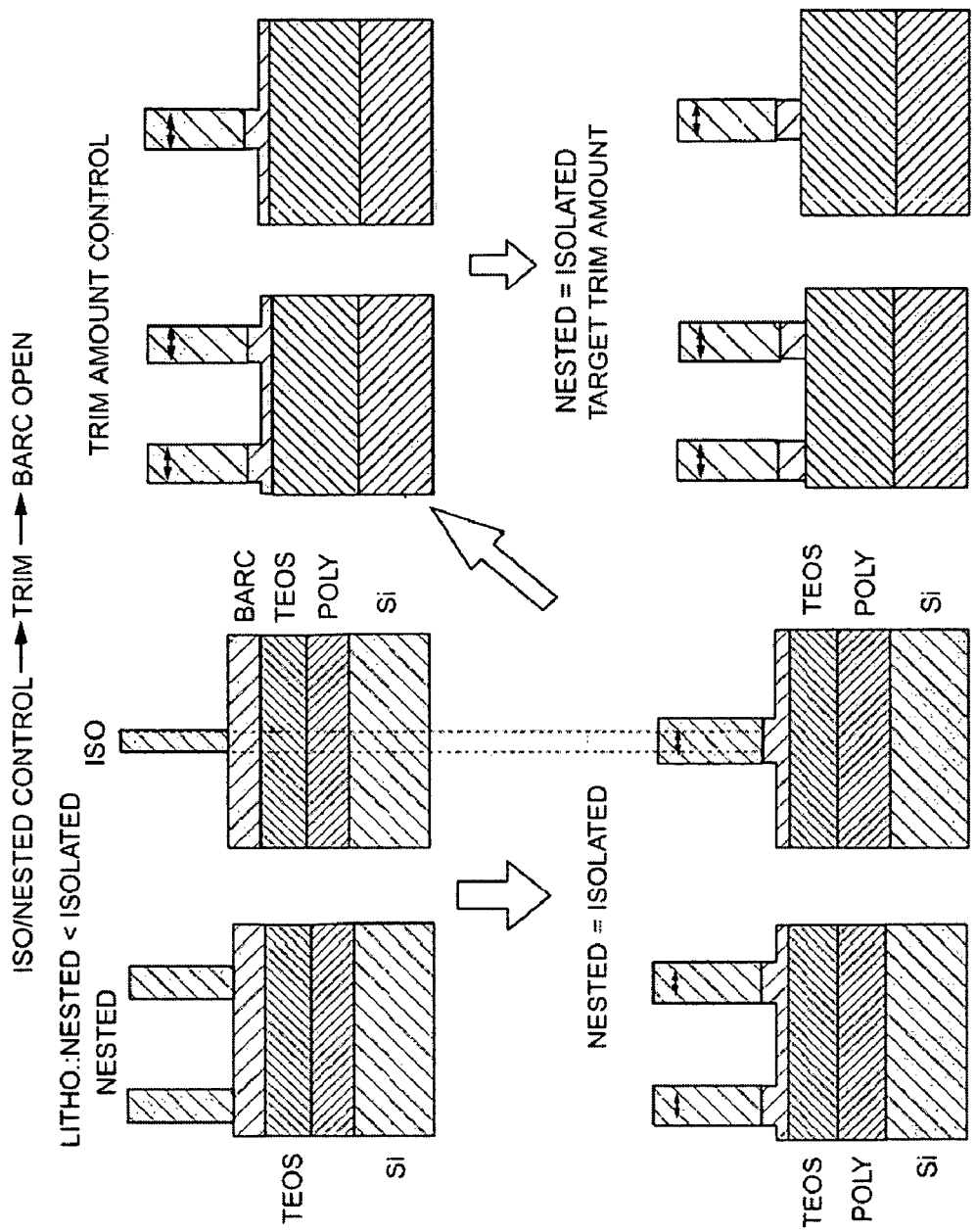

In a seventh trimming procedure shown in FIG. 5C, the nested soft mask (photoresist) feature size can be greater than the isolated soft mask (photoresist) feature size, and a third Nes-Greater Control Strategy can require that the iso/nested deposition process be executed process be executed first, the trim process be executed second, and the BARC open etching process be executed last.

First, an iso/nested deposition process can be performed in which unequal amounts are deposited to the isolated soft mask features and the nested soft mask features. During the iso/nested deposition process, the deposition rate can be larger on the isolated features and after the deposition process is performed, the isolated soft mask (photoresist) feature size can be greater than or substantially equal to the nested soft mask (photoresist) feature size. During an iso/nested deposition process, a hard mask (BARC) layer can be partially coated (not shown).

Next, a trim process can be performed in which substantially the same amount is trimmed (laterally etched) from the isolated soft mask features and the nested soft mask features. After the trim process is performed, the size of the isolated soft mask features remains substantially the same as the size of the nested soft mask features. During a trim process, a hard mask (BARC) layer can be partially etched.

Finally, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed. After the BARC open etching process is performed, the size of the isolated hard mask features and the nested hard mask features is substantially equal to the required CD.

Figure 5D:
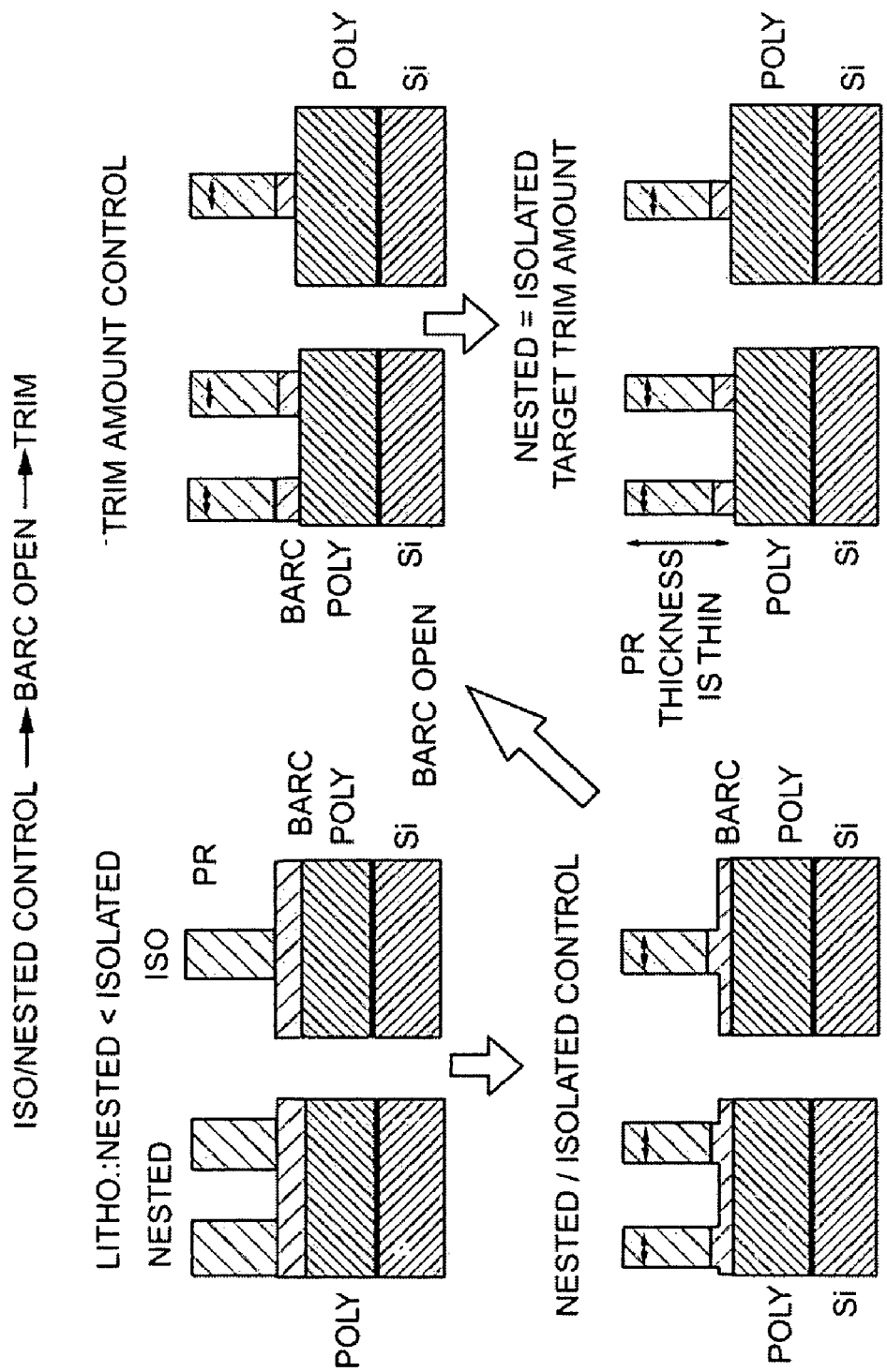

In an eighth trimming procedure shown in FIG. 5D, the nested soft mask (photoresist) feature size can be larger than the isolated soft mask (photoresist) feature size, and a fourth Nes-Greater Control Strategy can require that the iso/nested deposition process be executed process be executed first, the BARC open etching process be executed second, and the trim process be executed last.

First, an iso/nested deposition process can be performed in which unequal amounts are deposited to the isolated soft mask features and the nested soft mask features. During the iso/nested deposition process, the deposition rate can be larger on the isolated features and after the deposition process is performed, the isolated soft mask (photoresist) feature size can be greater than or substantially equal to the nested soft mask (photoresist) feature size. During an iso/nested deposition process, a hard mask (BARC) layer can be partially coated (not shown).

Next, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed.

Finally, a trim process can be performed in which substantially the same amount is trimmed (laterally etched) from the isolated soft mask features and the nested soft mask features. In addition, during the trim process, substantially the same amount is trimmed from the isolated hard mask features and the nested hard mask features. After the trim process is performed, the size of the isolated hard mask features and the nested hard mask features is substantially equal to the required CD. After the trim process, the size of the soft mask features can be equal to or less than the size of the hard mask features.

The data collection (DC) plans associated with the Nes-Greater Control Strategy can be executed. Data collection plan applications can run before, during, and/or after control plans are executed. Data collection plans can obtain data from processing elements such as a tool, a module, a chamber, and a sensor; measuring elements such as a OES system, ODP system, a SEM system, a TEM system, and a MES system.

In addition, the data collection plan selection and initiation can also be context-based. DC plans can be used to provide data for mapping applications that are associated with the Nes-Greater Control Strategy. The DC plan determines which data is collected, how the data is collected, and where the data is stored. The controller can auto-generate data collection plans for physical modules. Typically, one data collection plan can be active at a time for a specific module, and the controller can select and use a data collection plan that matches the wafer context. Data can include trace data, process log information, recipe data, maintenance counter data, ODP data, OES data, VIP data, or analog data, or a combination of two or more thereof. Measurement devices and/or sensors can be started and stopped by a DC plan.

In addition, when an Iso-Greater or Nes-Greater Analysis Strategy is executed, wafer data, process data, and/or module data can be analyzed, and alarm/fault conditions can be identified. The analysis plans associated with the Analysis Strategy can also be executed. The analysis plans can include a Trim Control analysis plan for analyzing a trimming process, an iso/nested analysis plan for analyzing an iso/nested etching process, or a BARC open analysis plan for analyzing a BARC etching process, or any combination of two or more thereof.

In addition, judgment and/or intervention plans can be executed. For example, after the data has been collected, the data can be sent to a judgment and/or intervention plan for run-rule evaluation. Fault limits can be calculated automatically based on historical data or entered manually based on the customer's experience or process knowledge, or obtained from a host computer. The data can be compared with the warning and control limits, and when a run-rule is violated, an alarm can be generated, indicating the process has exceeded statistical limits.

Furthermore, when an Iso-Greater or Nes-Greater Analysis Strategy is executed, wafer data maps, process data maps, and/or module data maps can be analyzed, and alarm/fault conditions can be identified. In addition, when mapping analysis plans are associated with the Analysis Strategy, they can be executed. For example, the mapping analysis plans may include an analysis plan for Trim Control maps when analyzing a trimming process, an analysis plan for iso/nested maps when analyzing an iso/nested etching process, and an analysis plan BARC open maps when analyzing a BARC etching process.

In addition, when judgment and/or intervention plans are associated with mapping applications, they can be executed. For example, after a map has been created, the map can be analyzed using run-rule evaluation techniques. Fault limits can be calculated automatically based on historical maps or entered manually based on the customer's experience or process knowledge, or obtained from a host computer. The maps can be compared with the warning and control limits, and when a run-rule is violated, an alarm can be generated, indicating the process has exceeded statistical limits.

When an alarm is generated, the controller can perform either notification or intervention. Notification can be via e-mail or by an e-mail activated pager. In addition, the controller can perform an intervention: either pausing the process at the end of the current lot, or pausing the process at the end of the current wafer. The controller can identify the processing module that caused the alarm to be generated.

A strategy can include a data failure field that can be used to enter/edit the data failure action. For example, a data failure may occur when a mapping application fails or a map could not be completed. When a data failure occurs the system response can be selected from among the following options:

(a) Use Tool Process Recipe (Nominal Recipe)—the software sends the indication to the process tool and the process tool uses the tool process recipe; (b) Do Not Use Process Recipe (Null Recipe)—the software sends the null recipe information associated with the wafer to the process tool and the wafer goes in and out of the chamber without being processed; (c) PM Pause—pauses the process module or (d) System Pause—pauses the system including transfer system. Other options should be apparent to those skilled in the art. Results from analysis plans, judgment plans, and intervention plans can feed forward and/or feedback data to other plans, and the other plans can use this data to calculate their outputs.

When examining a trimming procedure, a control strategy can include one or more equations that can be created to model the process space. In one embodiment, the following types of model equations (y(rp)=f(x,rp)) can be used. In one case, y(rp) can be equal to a desired process result at a radial position (r) on the wafer. For example, y(rp) can be a desired process result such as "Trim Amount" [TA(rp)], and x(rp) can be equal to a process parameter (Control Variable) that has been related to y(rp). In the process space, one or more model equations can be determined by creating a polynomial and finding the coefficients of the polynomial which relates a process gas flow rate to a trim amount in a first part of the process space. For example, an $N^{th}$ order polynomial can be used $$PR(rp) = \sum_0^N A_n [DV(rp)]^n$$

where DV(rp) is a dynamic variable that can vary with radial position (rp), PR(rp) is a required process result that can vary with radial position (rp), N>=1; and $A_n$ can comprise a constant having a positive value, a negative value, or a zero value. In one embodiment, the $N^{th}$ order polynomial can be solved to determine a value for DV(rp).

Alternately, an inverse equation can be determined by creating a different polynomial and finding the coefficients of the different polynomial which can relate process variable (gas flow rate) to a process result (trim amount) in different parts of the inverse process space. For example, an $N^{th}$ order polynomial can be used $$DV(rp) = \sum_0^N C_m [PR(rp)]^m$$

where DV(rp) is a dynamic variable that can vary with radial position (rp), PR(rp) is a required process result, such as trim amount, that can vary with radial position (rp), N>=1, and $C_m$ can comprise a constant having a positive value, a negative value, or a zero value.

The controller can create a list of terms for this type of model to manipulate. The terms can be defined by the controller and can be assigned to at least one step in the process. Alternately, a Recipe Parameter Map can be created in which each term is assigned a parameter's value.

Figure 6:
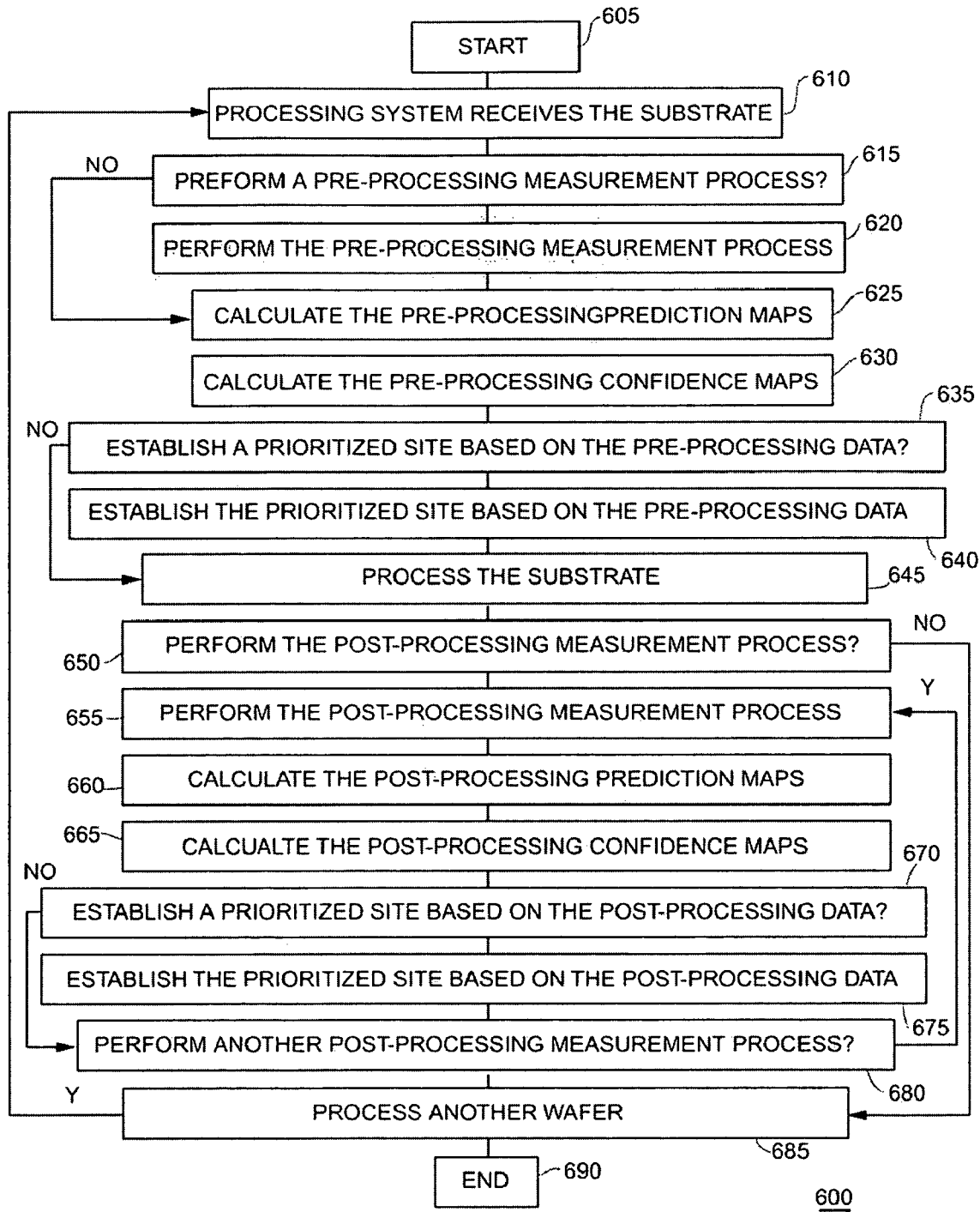
FIG. 6 illustrates an exemplary flow diagram of a method for operating a processing system in accordance with an embodiment of the invention.

FIG. 6 illustrates an exemplary flow diagram of a method for operating a processing system in accordance with an embodiment of the invention. Procedure 600 starts at task 605. In one embodiment, a host system can download recipes and/or variable parameters to a processing tool, such as processing tool 110 (FIG. 1). In addition, a host system can determine wafer sequencing. The downloaded data can include process recipes, metrology recipes, and wafer sequencing. When all of the system recipes that are referenced by the control plans in the matching control strategy have been verified, the controller 120 sends a message to the processing tool 110 indicating that the system recipe verification was successful. If the system recipe is verified, the lot can start with R2R control. If it is not verified, the lot cannot start with R2R control.

In task 610, when a wafer is received by a processing system 100 (FIG. 1), the pre-process data associated with the wafer and/or lot can be received. Pre-process data can include reference map(s), measurement map(s), prediction map(s), and/or confidence map(s) for an in-coming wafer and/or in-coming lot. Pre-process data can include measurement data from a measurement module associated with a lithography system such as a Lithius® System from Tokyo Electron Limited and/or measurement data from an etching system such as a Telius® System from Tokyo Electron Limited.

In task 615, a query can be performed to determine when to perform a pre-processing measurement process. When the process is mature, the process results should be constant and the pre-processing measurement process should not be required for all wafers. However, some wafers may be identified as process verification wafers and a pre-processing measurement process can be performed on these wafers. When the process is immature and the process results are varying, the pre-processing measurement process can be performed on a larger number of wafers. When pre-processing measurement process is not required, procedure 600 can branch to task 625, and when post-processing measurement process is not required, procedure 600 can branch from task 650 to task 685.

In task 620, a pre-processing measurement process can be performed. In one embodiment, a control strategy can be executed and used to establish a pre-processing measurement process recipe. For example, the wafer can be sent to an IMM 140 (FIG. 1) where the features of a patterned soft mask layer on a wafer can be measured before a trimming procedure is performed. One or more data collection (DC) plans and/or mapping applications can be used. Alternatively, a different metrology system can be used.

Figure 7A:
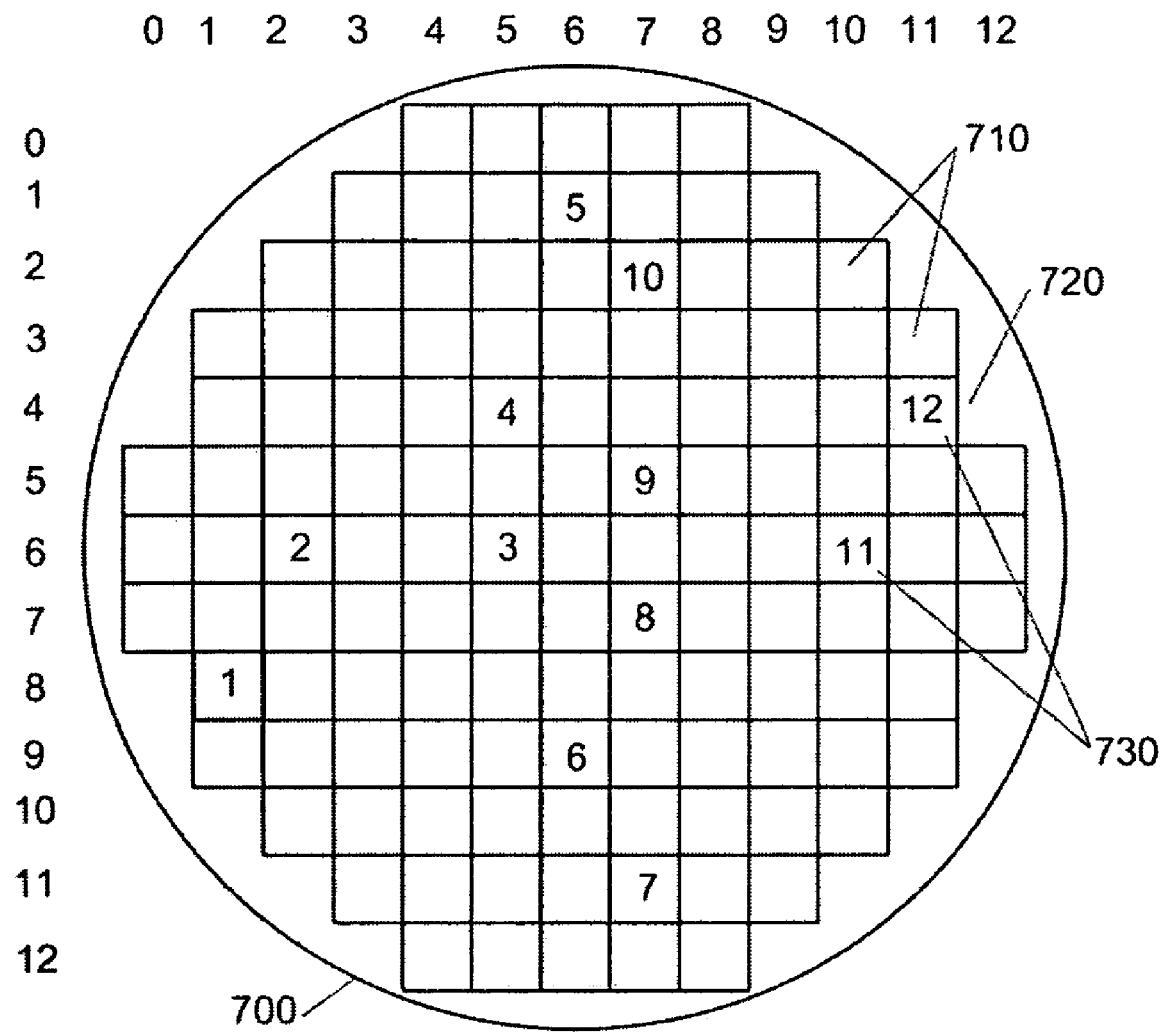
FIGS. 7A and 7B show exemplary views of pre-processing measurement maps in accordance with embodiments of the invention.
Figure 7B:
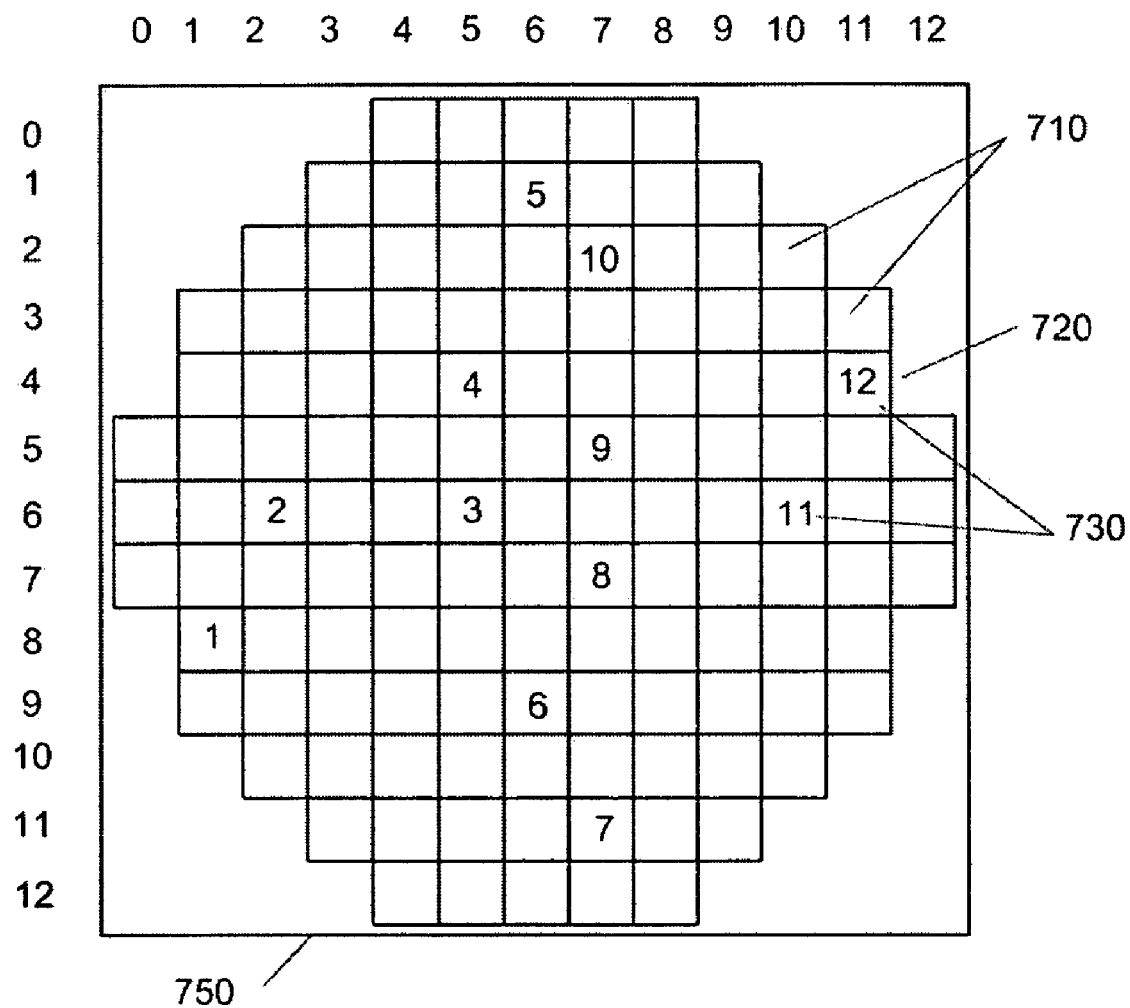

FIG. 7A shows a simplified view of a pre-processing measurement map 720 on a circular wafer 700 that includes a plurality of chip/dies 710. FIG. 7B shows a simplified view of a pre-processing measurement map 720 on a square wafer 750 that includes a plurality of chip/dies 710. In the illustrated embodiments, one-hundred twenty-five chip/dies are shown, but this is not required for the invention. Alternatively, a different number of chip/dies may be shown. In addition, the shapes shown are for illustration purposes and are not required for the invention. For example, chip/dies may also have rectangular shapes.

The rows and columns are numbered from zero to twelve for illustration. In addition, twelve chip/dies 730 are labeled (1-12), and these chip/dies can be used to define the location of the measurement sites for the illustrated pre-processing measurement plan 720. Alternatively, other pre-processing measurement plans and/or other measurement sites may be used.

A pre-processing measurement plan can be specified by a semiconductor manufacturer based on data stored in a historical database. For example, a semiconductor manufacturer may have historically chosen a number of positions on the wafer when making SEM measurements and would like to correlate the measured data from a integrated metrology tool to the data measured using a SEM tool. Other manufacturers can use TEM and/or Focused Ion Beam (FIB) data.

In one embodiment, measurement features, such as periodic gratings, on a pre-processed wafer can be measured at one or more of the twelve (1-12) locations shown in FIGS. 7A and 7B. For example, the features on a pre-processed wafer may be in a photoresist layer as shown in FIGS. 4A-4D and 5A-5D. The pre-processing measurement map can include measured metrology data for the wafer including metrology data for at least one isolated bi-layer structure on the wafer, metrology data for at least one nested bi-layer structure on the wafer, or mask data.

The pre-processing measurement process can be time consuming and can affect the throughput of a processing system. During process runs, a manufacturer may wish to minimize the amount of time used to measure a wafer. The pre-processing measurement plan can be context driven and different strategies and/or plans may be selected based on the context of the wafer. For example, one or more wafers may not be measured and/or the pre-processing measurement process may be performed using a subset of measurement sites included in the pre-processing measurement plan 720.

In one embodiment, during a development portion of the semiconductor process, one or more reference maps can be created and stored for later use as historical data. A reference measurement map can include measured data at more sites than are shown in pre-processing measurement map 720. Alternatively, a reference measurement map can use the same set of measurement sites or a reference measurement map may not be required.

A reference prediction map can include predicted measured data at more sites than are shown in pre-processing measurement map 720. Alternatively, a reference prediction map can use the same set of measurement sites or a reference prediction map may not be required.

A reference confidence map can include confidence data at more sites than are shown in pre-processing measurement map 720. Alternatively, a reference confidence map can use the same set of measurement sites or a reference confidence map may not be required.

The measurement, prediction, and/or confidence maps can include one or more Goodness Of Fit (GOF) maps, one or more grating thickness maps, one or more Critical Dimension (CD) maps, one or more CD profile maps, one or more material thickness maps, one or more material cross section area maps, one or more trench cross section area maps, one or more sidewall angle maps, one or more differential width maps, or a combination thereof. The pre-process data can also include site result data, site number data, CD measurement flag data, number of measurement sites data, coordinate X data, and coordinate Y data, among others.

In task 625, one or more pre-processing prediction maps can be calculated. FIG. 8 shows a simplified view of a pre-processing prediction map 800 including a plurality of chip/dies 810, the previously discussed twelve measurement sites 830 numbered (1-12), and a reference side 840 that can indicate a notch location. In one embodiment, curve-fitting procedures can be performed to calculate data for the sites on the wafer that are not measured. In another embodiment, the prediction maps may be determined using surface estimating, surface fitting techniques, or other mathematical techniques.

In one embodiment, a first pre-processing equation can be determined using the measured data from the sixth row (measurement sites 2, 3, and 11), and this first pre-processing equation can be used and/or modified to calculate the predicted values (expected measured data) for chip/dies (6-3, 6-4, 6-6, 6-7, 6-8, and 6-9), and the first pre-processing equation can be used and/or modified to extrapolate predicted values for chip/dies (6-0, 6-1, 6-11, and 6-12). Alternatively, other measurement sites may be used to determine the first pre-processing equation.

The first pre-processing equation and/or a modified version can be used to calculate/predict values the chip/dies in row five and row seven. The first pre-processing equation can be modified as necessary to fit the measured data in row five (measurement site 9) and in row seven (measurement site 8). An error condition can be declared when the first pre-processing equation cannot be determined and/or modified properly. In addition, an error condition can be declared when one or more of the measured values and/or calculated/predicted values are outside a uniformity limit established for the wafer.

The first pre-processing equation and/or a modified version can also be used to calculate/predict values for the remaining sites on the wafer. In one embodiment, the entire first pre-processing prediction map can be calculated using the first pre-processing equation and/or a modified version. An error condition can be declared when one or more of the values calculated and/or predicted values are outside a uniformity limit established for the wafer. Alternatively, the first pre-processing equation and/or a modified version may be used to calculate/predict values for a portion of the wafer. For example, the portion may include one or more quadrants.

In addition, a second pre-processing equation can also be determined using the measured data from the seventh column (measurement sites 7, 8, 9, and 10), and this second equation can be used and/or modified to calculate the predicted values (expected measured data) for chip/dies (3-7, 4-7, 6-7, 8-7, 9-7, and 10-7), and the second pre-processing equation can be used and/or modified to extrapolate predicted values for chip/dies (0-7, 1-7, and 12-7). Alternatively, other measurement sites may be used to determine the second pre-processing equation.

The second pre-processing equation and/or a modified version can be used to calculate/predict values for the chip/dies in column five and column six. The second pre-processing equation can be modified as necessary to better fit the measured data in column six (measurement sites 5, and 6) and in column five (measurement sites 4, and 3). An error condition can be declared when the second pre-processing equation cannot be determined and/or modified properly. In addition, an error condition can be declared when one or more of the measured values and/or calculated/predicted values are outside a uniformity limit established for the wafer.

The second pre-processing equation and/or a modified version can also be used to calculate/predict values for the remaining sites on the wafer. In one embodiment, the entire second pre-processing prediction map can be calculated using the second pre-processing equation and/or a modified version. An error condition can be declared when one or more of the values calculated and/or predicted values are outside a uniformity limit established for the wafer. Alternatively, the second pre-processing equation and/or a modified version may be used to calculate/predict values for a portion of the wafer. For example, the portion may include one or more quadrants.

Alternatively, the first pre-processing prediction map can be calculated using only the first pre-processing equation and/or the second prediction pre-processing map can be calculated using only the second pre-processing equation. For example, a procedure such as this could be used to reduce the processing time for substantially uniform processes.

Figure 9:
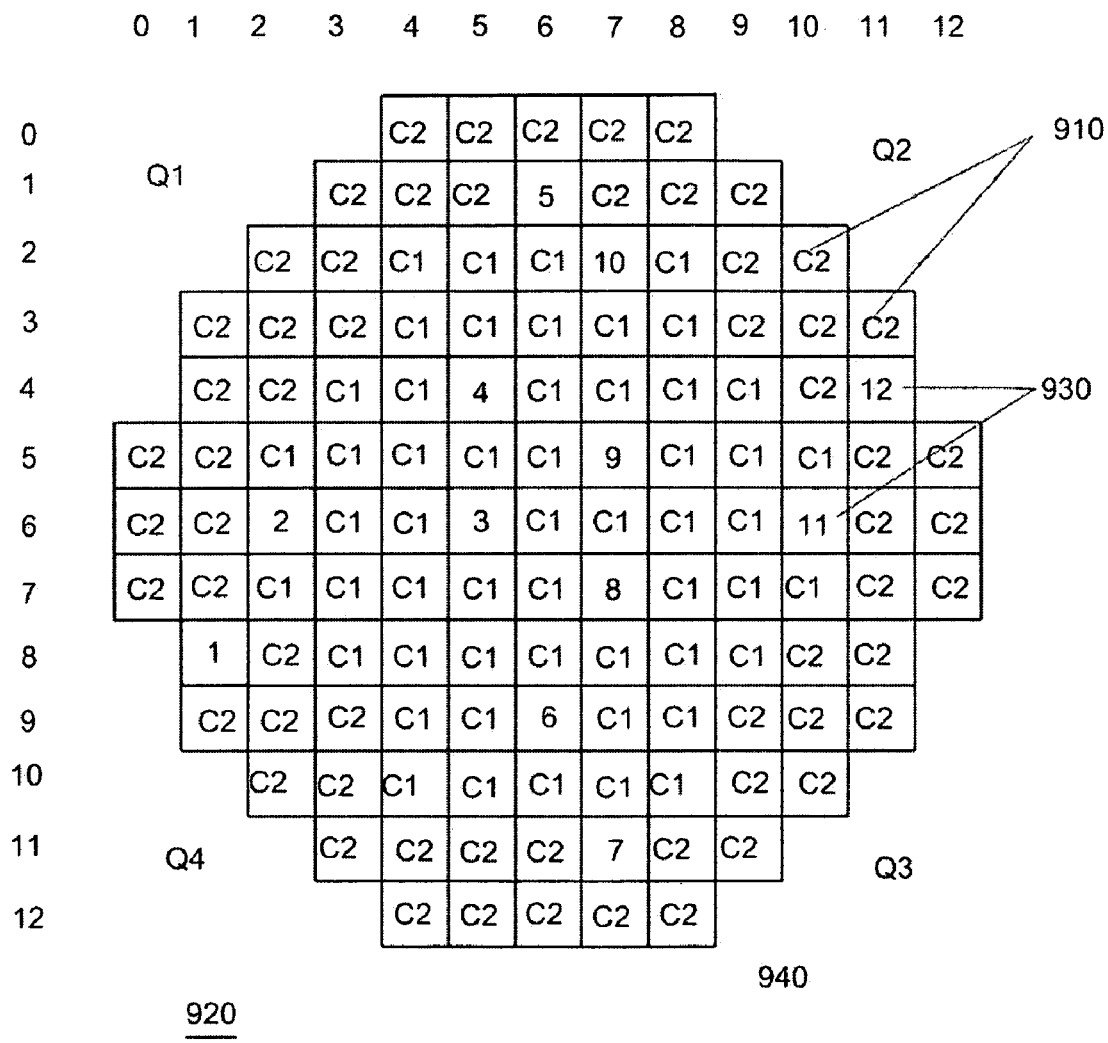
FIG. 9 illustrates an exemplary view of a pre-processing confidence map in accordance with embodiments of the invention.

In task 630, one or more pre-processing confidence maps can be calculated. FIG. 9 shows a simplified view of a confidence map 900 including a plurality of chip/dies 910 and the previously discussed twelve measurement sites (1-12). In one embodiment, a pre-processing confidence map can be calculated using the differences between the first pre-processing prediction map and the second pre-processing prediction map. Alternatively, a pre-processing confidence map may be calculated using the differences between a pre-processing prediction map and a reference measurement map.

As shown in the illustrated embodiment, a confidence map can be divided into different areas as shown using the values "C1" and "C2" and different values and/or rules can be established for the different areas. For example, two areas can be used to account for differences between a center region and an edge region. Alternatively, a different number of areas may be used.

In another embodiment, a pre-processing confidence map can be calculated using the differences between a pre-processing prediction map and the uniformity limits established for the wafer. For example, when a value in a prediction map is close to uniformity limit, the confidence value may be lower than when the value in a prediction map is not close to uniformity limit.

In task 635, a query can be performed to determine when to establish a prioritized site based on the pre-processing data. When the values in all areas of the confidence map are high, it is not necessary to establish a new prioritized site. In other embodiments, when the differences between the prediction maps are small and/or when the differences between the pre-processing prediction map and a reference measurement map are small, it is not necessary to establish a new prioritized site.

In addition, when the values on a confidence map are consistently high for a particular process, a new measurement plan may be establish that uses a smaller number of measurement sites and that decreases the through-put time.

When one or more values in one or more areas of the confidence map are low, one or more new prioritized sites can be established in those areas. In other embodiments, when the differences between the prediction maps are large and/or when the differences between the pre-processing prediction map and a reference measurement map are large, one or more new prioritized sites can be established. For example, prioritized sites can be established for the entire wafer or for a particular area such as a particular quadrant (Q1, Q2, Q3, or Q4).

When a prioritized site is required, procedure 600 can branch to task 640, and when a prioritized site is not required, procedure 600 can branch to task 645.

Figure 10:
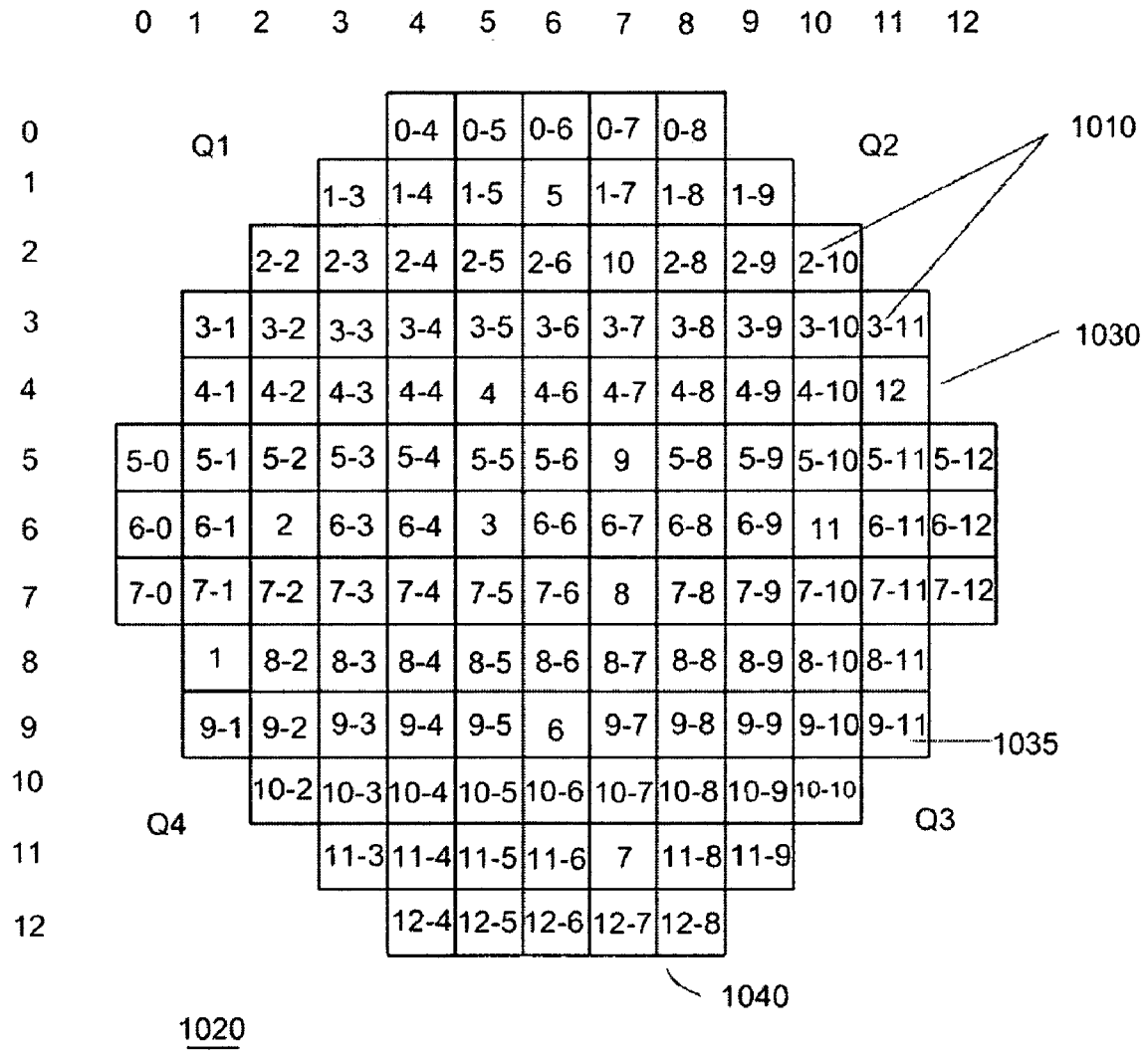
FIG. 10 shows an exemplary view of a new pre-processing measurement map in accordance with embodiments of the invention.

In task 640, one or more prioritized sites can be established. FIG. 10 shows a simplified view of a new pre-processing measurement map 1020 including a plurality of chip/dies 1010, a new pre-processing measurement site 1035, the previously discussed twelve measurement sites 1030 labeled as (1-12), and a reference side 1040 that can indicate a notch location on a wafer or a specific side of a substrate. Alternatively, a new pre-processing measurement map may include a plurality of prioritized sites at different locations on the wafer. When confidence values are low in one area of the wafer, one or more prioritized sites can be established in that area as pre-processing measurement sites. For example, when to confidence values are low in the first quadrant (Q1) chip/site (3-2) may be identified as the prioritized site and the metrology tool is instructed to make measurements at the site.

The pre-processing confidence map can be a measure of the confidence in the calculated pre-processing predicted values and can also be a measure of the confidence in the measured pre-processing data and pre-processing predicted data being within the required specifications.

When a new pre-processing prioritized site is required, a new pre-processing metrology recipe can be created, and the new recipe can be used to instruct the metrology tool to make additional pre-processing measurements at the one or more prioritized sites.

In one embodiment, the new pre-processing prioritized site can be selected from a set of previously defined sites. For example, during a setup and/or verification procedure, measurements may have been made at more than forty sites, and one or more of these sites can be used. Alternatively, the new pre-processing prioritized site may not be selected from a set of previously defined sites.

When the pre-processing confidence map is calculated while the wafer is in the metrology tool, the additional measurements at newly established prioritized sites can be performed with the minimum amount of delay. When the confidence map is calculated after the wafer has left the metrology tool, the new recipe can be used at a later time, and the additional measurements at the prioritized sites can be performed after some delay time.

In one embodiment, when the measured data for a prioritized site is created, it can be compared to the data in the pre-processing prediction maps. Alternatively, when the measured data for a prioritized site is created, it can be stored and compared to the data in the pre-processing prediction maps at a later time. An error condition can be declared when the measured data for a prioritized site is outside a limit established by a wafer uniformity specification.

When the measured data for a prioritized site is close to the value in a particular prediction map, that prediction map can be used in the area around the prioritized site. For example, when the one or more prioritized sites are in the first quadrant and the measured value(s) are close to the value(s) in the first pre-processing prediction map, then the first pre-processing prediction map can be used in the first quadrant.

When the measured data for a prioritized site is not close to the value in a particular prediction map, a new prediction map can be created and can be used in the area around the prioritized site. For example, when the one or more prioritized sites are in the first quadrant and the measured value(s) are not close to the value(s) in the pre-processing prediction maps, then a new pre-processing prediction map can be created and used in the first quadrant.

Whenever a prediction map changes, a new confidence map or a new portion of a confidence map can be calculated.

In task 645, the wafer can be processed if the confidence map is within the required limits. In one embodiment, a trimming procedure can be performed and the trimming procedure can be performed in a number of different ways as shown in FIGS. 4A-4D and FIGS. 5A-5D. Alternatively, a different procedure may be performed.

During a trimming procedure, one or more process recipes and one or more sets of control settings (recipe parameters) can be calculated. When circular wafers are being processed, process recipes can be tuned for changes occurring in a radial direction, and when non-circular wafers are being processed, process recipes can be tuned for changes occurring in a lateral direction.

In one embodiment, a lateral trimming process can be performed to change the size and/or shape of a feature. The processing system 100 (FIG. 1) can use a trimming recipe (as described herein) to process the wafer. For example, the trimming procedure may include a Chemical Oxide Reduction (COR) process. Methods and systems for performing a COR process are taught in co-pending U.S. patent application Ser. No. 10/736,983, entitled "Method of Operating a System For Chemical Oxide Removal" by Tomoyasu, et al., filed on Dec.

17, 2003, and U.S. patent application Ser. No. 10/705,201, entitled "Processing System and Method For Treating a Substrate" by Hamelin, et al., filed on Nov. 12, 2003, and both are incorporated by reference herein.

Figure 11:
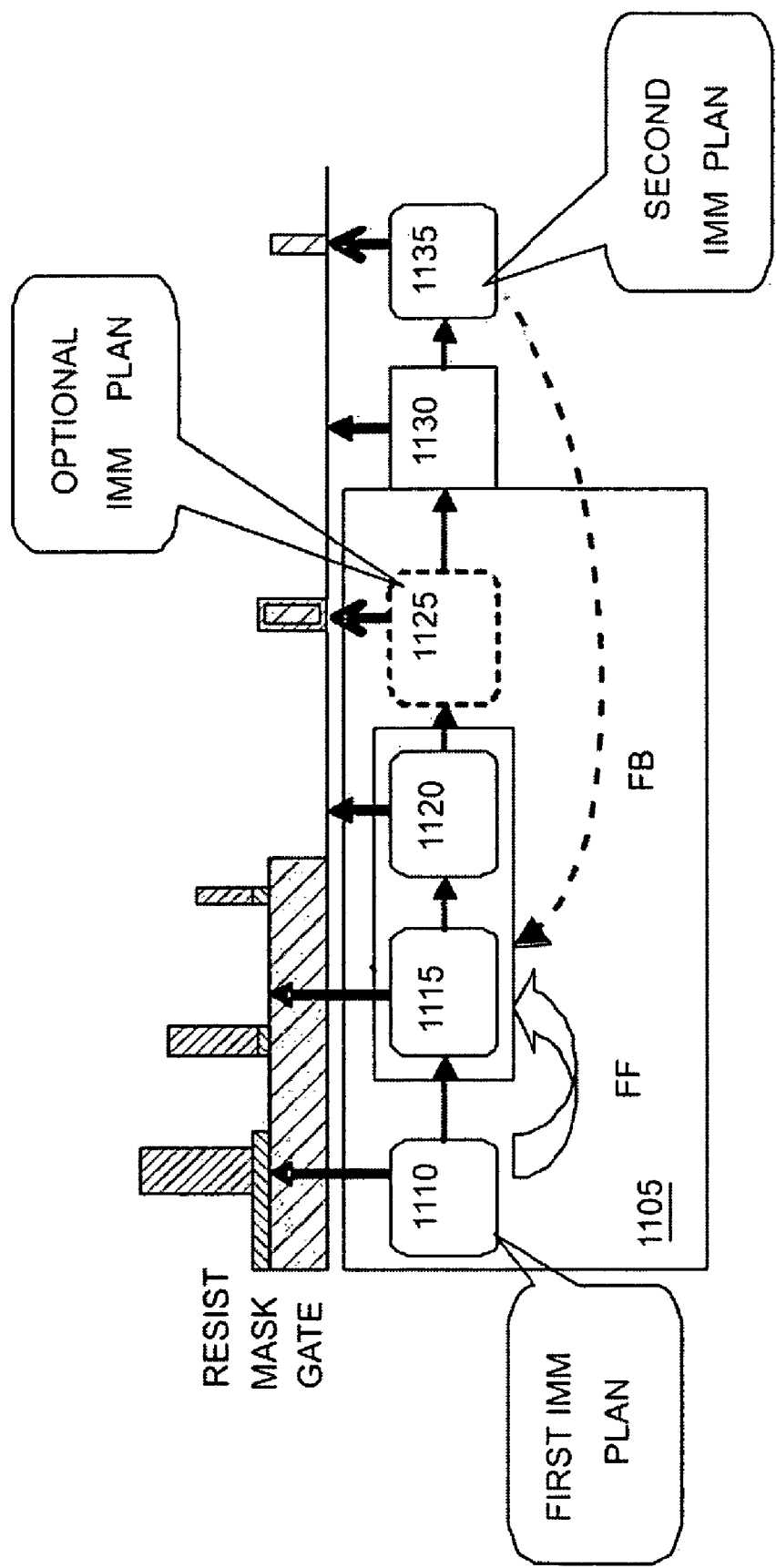
FIG. 11 illustrates an exemplary gate forming process in accordance with embodiments of the invention.

FIG. 11 illustrates a simplified schematic view of a gate formation process in accordance with embodiments of the invention. In the illustrated embodiment, a processing tool 1105 is shown, a first measurement process 1110 is shown, a trimming process 1115 is shown, a gate etching process 1120 is shown, an optional measurement process 1125 is shown, a cleaning process 1130 is shown, and a second measurement process 1135 is shown. Alternatively, a different set of processes may be used. For example, fewer measurement steps may be used, and/or a measurement step may be performed before the Hard Mask Open (HMO) step.

In one embodiment, the first measurement process 1110 can be a pre-processing measurement procedure, and pre-processing maps, such as measurement maps, prediction maps, confidence maps, and/or reference maps, can be established using the data obtained during the first measurement process 1110. As shown in FIG. 11, a first IMM plan can be associated with the first measurement process 1110, but this is not required for the invention. Alternatively, a first measurement process 1110 may not be required. The first IMM plan can change with time and can be used to determine a sampling procedure. For example, one hundred percent of the wafers can be measured (sampled) when immature processes are being performed, and less than one hundred percent of the wafers can be measured (sampled) when mature processes are being performed.

In one embodiment, the second measurement process 1135 can be a post-processing measurement procedure, and post-processing maps, such as measurement maps, prediction maps, confidence maps, and/or reference maps, can be established using the data obtained during the second measurement process 1135. As shown in FIG. 11, a second IMM plan can be associated with the second measurement process 1135, but this is not required for the invention. Alternatively, a second measurement process 1135 may not be required. The second IMM plan can change with time and can be used to determine a sampling procedure. For example, one hundred percent of the wafers may be measured (sampled) when immature processes are being performed, and less than one hundred percent of the wafers may be measured (sampled) when mature processes are being performed.

Alternatively, the optional measurement process 1125 may be a pre-processing measurement procedure or a post-processing measurement procedure, and pre/post-processing maps, such as measurement maps, prediction maps, confidence maps, and/or reference maps, can be established using the data obtained during the optional measurement process 1125. As shown in FIG. 11, an optional IMM plan can be associated with the optional measurement process 1125, but this is not required for the invention. Alternatively, an optional measurement process 1125 may not be required. The optional IMM plan can change with time and can be used to determine a sampling procedure. For example, up to one hundred percent of the wafers may be measured (sampled) when immature processes are being performed, and less than one hundred percent of the wafers may be measured (sampled) when mature processes are being performed.

Data including maps can be fed forward (FF) and/or fed back (FB) to improve the wafer processing.

A trimming process 1115 can be used to process wafers having isolated and nested features and control strategies can be used to define the process sequence. During an isolated/nested measurement sequence, the processing tool selects one IM recipe to use, and separate IMM recipes can be used for isolated and nested structures. Each wafer can be measured separately for each pitch and structure.

During a measurement procedure, a wafer can be loaded into an integrated metrology (IM) module; an IM recipe can be loaded into the IM module; and a Profiler Application Server (PAS) recipe can be loaded into the IM controller. Next, the wafer can be measured and an ODP recipe can be loaded into the IM controller. The library can then be searched using the measured spectrum, and one or more isolated structures can be identified. When isolated structures are being measured, IM, PAS, and ODP recipes for isolated structures can be used. Subsequently, another IM recipe can be loaded into an integrated metrology (IM) module, and another PAS recipe can be loaded into the IM controller. The wafer can be measured or previous measurement data can be used, and another ODP recipe can be loaded into the IM controller. Next, the library can be searched using the measured spectrum, and one or more nested structures can be identified. When Nested structures are being measured, IM, PAS, and ODP recipes for nested structures can be used. The measurement sequence can be performed for one or more different locations on a wafer, and the wafer can be unloaded.

In one embodiment, a measurement grating having a first pitch is provided that is consistent with the isolated structures/features for a particular product and technology and another measurement grating having a second pitch is provided that is consistent with the nested structures/features for this product and technology. For example, a 595 nm grating can be used for isolated structures and a 245 nm grating can be used for nested structures. In alternate embodiments, additional measurement gratings may be provided and different pitches may be provided. In other examples a 612 nm grating may be used.

In the illustrated embodiment, photoresist features are shown on a mask layer that is on top of a gate layer. Alternatively, multi-layer photoresist features may be present. In addition, the mask layer can include Anti-Reflective Coating (ARC), BARC, and/or Tunable Etch Resistance ARC (TERA) material. Furthermore, the gate layer can include semiconductor material, dielectric material, and/or metallic material.

In one embodiment, a previously calculated prediction map is used as the measured data map. Alternatively, a modified prediction map may be used.

Figure 12:
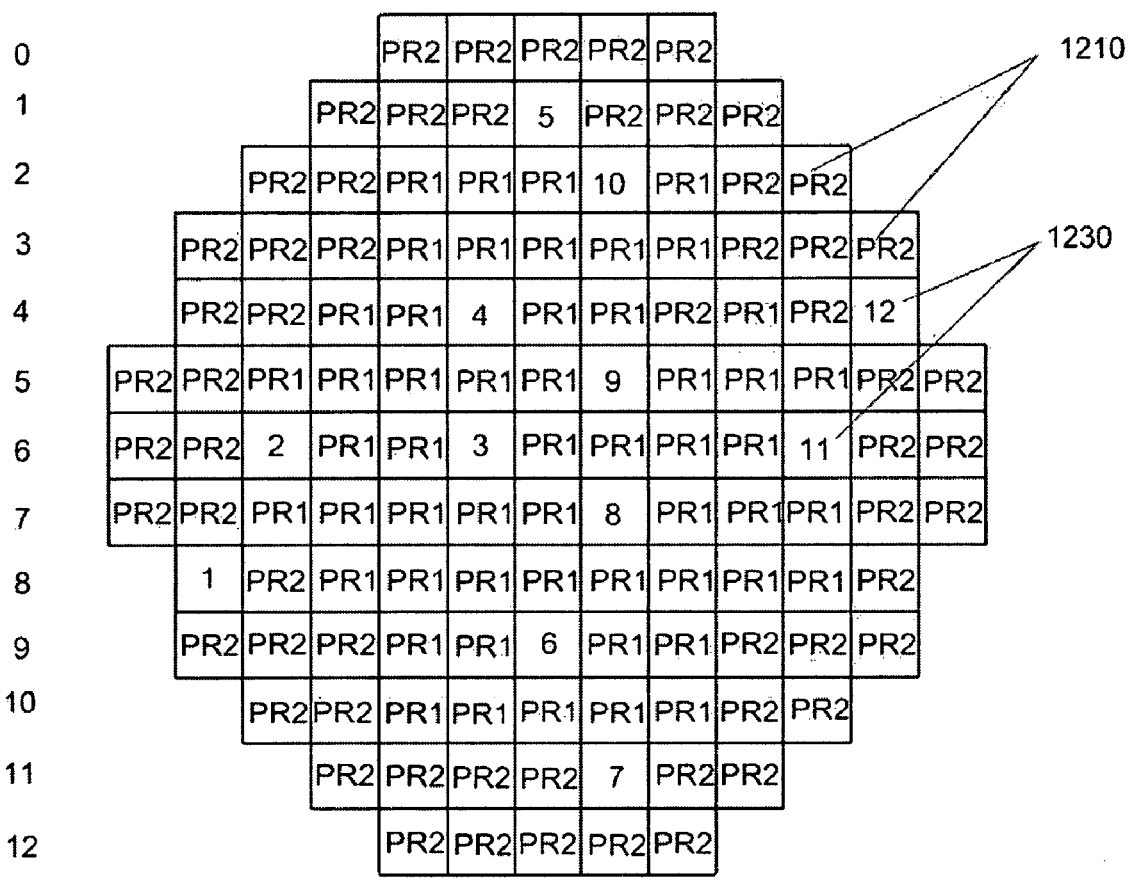
FIG. 12 shows a simplified view of a process results map in accordance with embodiments of the invention.

FIG. 12 shows a simplified view of a process results map in accordance with the invention. FIG. 12 shows a simplified view of a process results map 1220 including a plurality of chip/dies 1210, the previously discussed twelve measurement sites 1230 labeled as (1-12), and a reference side 1240 that can indicate a notch location on a wafer or a specific side of a substrate. In one embodiment, a process results map can be determined using a measurement map and/or a process map. Alternatively, a process results map may be determined using process models.

As shown in the illustrated embodiment, process results map can be divided into different areas as shown using the values "PR1" and "PR2" and different values and/or rules can be established for the different areas. Alternatively, a different number of areas may be used. The first group of sites "PR1" may have a first set of process results associated with them, and the second group of sites "PR2" may have a second set of process results associated with them. Two groups are not required for the invention, but they are shown for illustration purposes. Alternatively, a different number of groups may be used. For example, when a substantially uniform set of process results is expected, a single group may be used, and a two-group technique may be used to account for center region and an edge region differences. In addition, a two-zone technique can be used to simplify the calculation process or can be used whenever different process results and/or different measurement results are expected to occur for a center region and an edge region.

When a trimming procedure is performed, one or more process result maps can be used. For example, a trim map can be used to characterize the amount of lateral etching, a sidewall angle adjustment map can be used to characterize the amount of sidewall angle change, and tolerance maps can be used to identify allowable variations in one or more data items.

In task 650, a query can be performed to determine when to perform a post-processing measurement process. When the process is mature, the process results should be constant and the post-processing measurement process should not be required. However, some wafers may be identified as process verification wafers and a post-processing measurement process can be performed on these wafers. When the process is immature and the process results are varying, the post-processing measurement process can be performed. When post-processing measurement process is not required, procedure 600 can branch to task 685, and when post-processing measurement process is required, procedure 600 can branch to task 655.

In task 655, a post-processing measurement process can be performed. In one embodiment, a control strategy can be executed and used to establish the post-processing measurement process recipe. For example, the wafer can be sent to an IMM 140 (FIG. 1) where the features of a patterned wafer can be measured after a trimming procedure has been performed. Alternatively, a different metrology system can be used. For example a TEM and/or SEM measurements may be made.

Figure 13A:
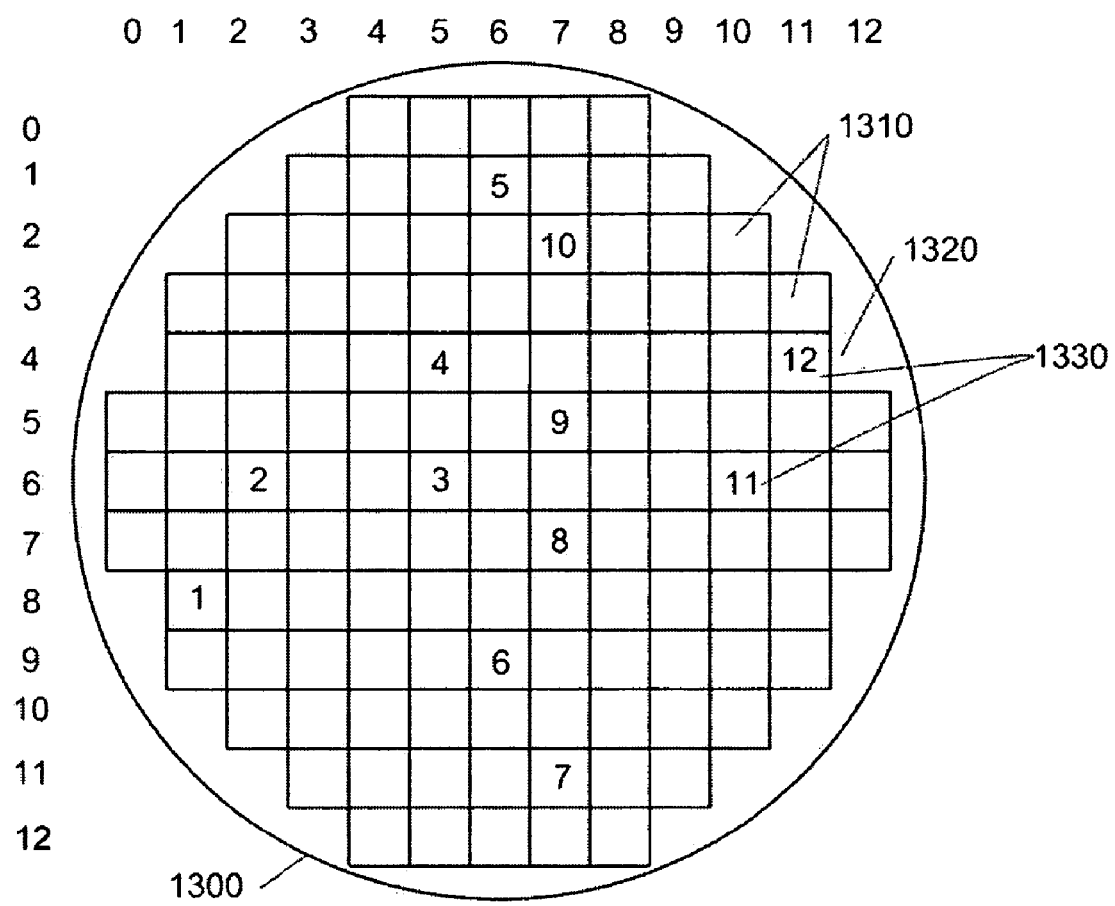
FIGS. 13A and 13B show exemplary views of post-processing measurement maps in accordance with embodiments of the invention.
Figure 13B:
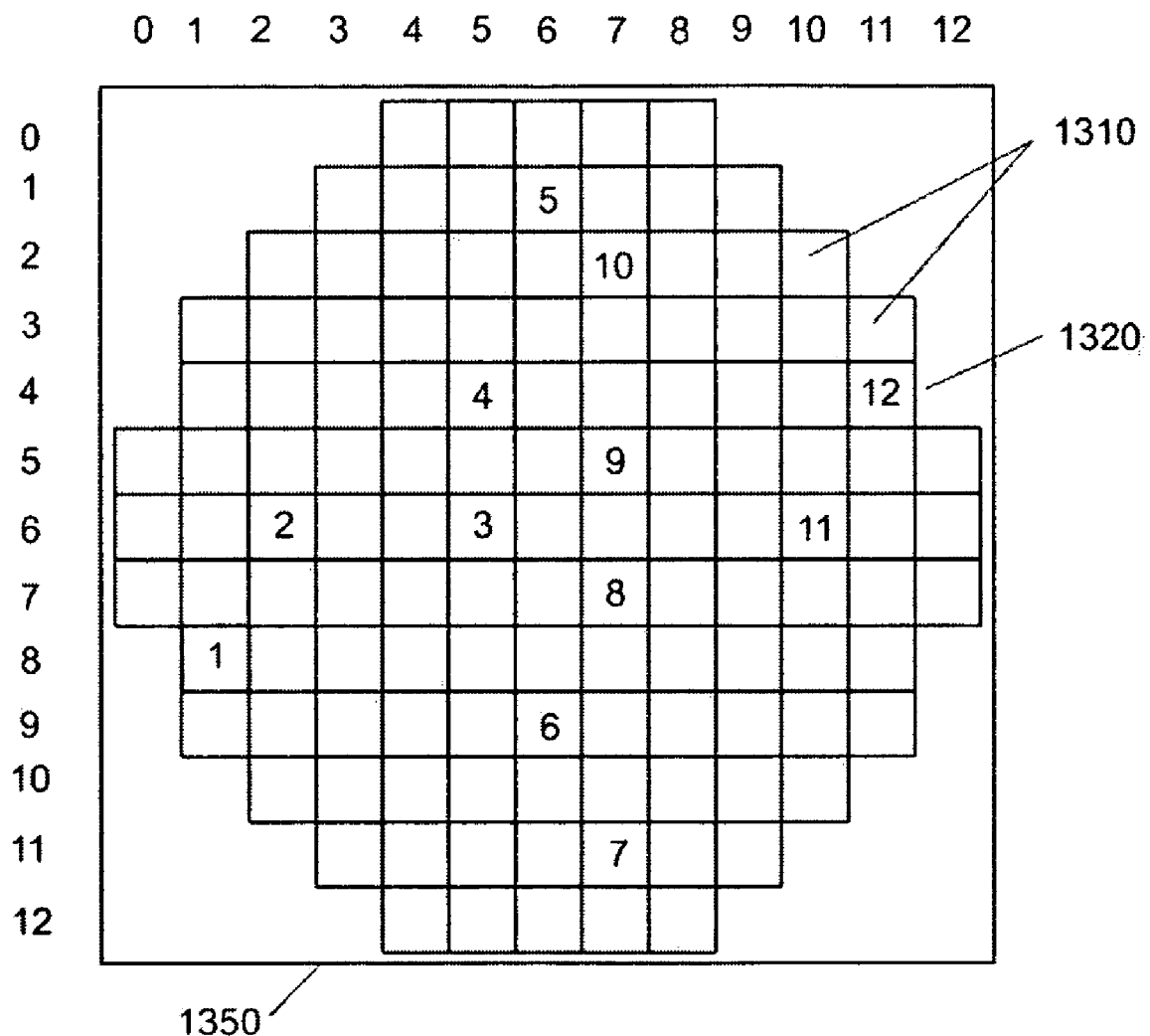

FIG. 13A shows a simplified view of a post-processing measurement map 1320 on a circular wafer 1300 that includes a plurality of chip/dies 1310. FIG. 13B shows a simplified view of a post-processing measurement map 1320 on a square substrate 1350 that includes a plurality of chip/dies 1310. In the illustrated embodiments, one-hundred twenty-five chip/dies are shown, but this is not required for the invention. Alternatively, a different number of chip/dies may be shown. In addition, the shapes shown are for illustration purposes and are not required for the invention. For example, chip/dies may also have rectangular shapes The rows and columns are numbered from zero to twelve for illustration. In addition, twelve chip/dies 1330 are labeled (1-12), and these chip/dies can be used to define the location of the measurement sites for the illustrated post-processing measurement plan 1320. Alternatively, other post processing measurement plans and/or other measurement sites may be used.

A post-processing measurement plan can be specified by a semiconductor manufacturer based on data stored in a historical database. For example, a semiconductor manufacturer may have historically chosen a number of positions on the wafer when making SEM measurements and would like to correlate the measured data from a integrated metrology tool to the data measured using a SEM tool. Other manufacturers can use FIB data.

In one embodiment, the features on a post-processed wafer can be measured at one or more of the twelve (1-12) locations shown in FIGS. 13A and 13B. For example, the features on a post-processed wafer may be as shown in FIGS. 4A-4D and 5A-5D.

The post-processing measurement maps can include one or more Goodness Of Fit (GOF) maps, one or more grating thickness maps, one or more Critical Dimension (CD) maps, one or more CD profile maps, one or more material thickness maps, one or more material cross section area maps, one or more trench cross section area maps, one or more sidewall angle maps, or one or more differential width maps, or a combination thereof. The post-process data can also include site result data, site number data, CD measurement flag data, number of measurement sites data, coordinate X data, and coordinate Y data, among others.

In task 660, one or more post-processing prediction maps can be calculated. FIG. 14 shows a simplified view of a post-processing prediction map 1420 including a plurality of chip/dies 1410, the previously discussed twelve measurement sites 1430 numbered (1-12), and a reference side 1440 that can indicate a notch location. In one embodiment, curve-fitting procedures can be performed to calculate data for the sites on the wafer that are not measured. In another embodiment, the prediction maps may be determined using surface estimating, surface fitting techniques, or other mathematical techniques.

In one embodiment, a first post-processing equation can be determined using the measured data from the sixth row (measurement sites 2, 3, and 11), and this first post-processing equation can be used and/or modified to calculate the expected post-processing measured data for chip/dies (6-3, 6-4, 6-6, 6-7, 6-8, and 6-9), and the first post-processing equation can be used and/or modified to extrapolate predicted values for the expected post-processing measured data for chip/dies (6-0, 6-1, 6-11, and 6-12). Alternatively, other measurement sites may be used to determine the first pre-processing equation.

The first post-processing equation and/or a modified version can be used to calculate/predict post-processing values for the chip/dies in row five and row seven. The first post-processing equation can be modified as necessary to fit the post-processing measured data in row five (measurement site 9) and in row seven (measurement site 8). An error condition can be declared when the first post-processing equation cannot be determined and/or modified properly. In addition, an error condition can be declared when one or more of the measured values and/or calculated/predicted values are outside a uniformity limit established for the wafer.

The first post-processing equation and/or a modified version can also be used to calculate/predict values for the remaining sites on the wafer. In one embodiment, the entire first post-processing prediction map can be calculated using the first post-processing equation and/or a modified version. An error condition can be declared when one or more of the values calculated and/or predicted values are outside a uniformity limit established for the wafer. Alternatively, the first post-processing equation and/or a modified version may be used to calculate/predict values for a portion of the wafer. For example, the portion may include one or more quadrants.

In addition, a second post-processing equation can also be determined using the post-processing measured data from the seventh column (measurement sites 7, 8, 9, and 10), and this second post-processing equation can be used and/or modified to calculate the expected post-processing measured data for chip/dies (3-7, 4-7, 6-7, 8-7, 9-7, and 10-7), and the second post-processing equation can be used and/or modified to extrapolate values for the expected post-processing measured data for chip/dies (0-7, 1-7, and 12-7). Alternatively, other measurement sites may be used to determine the second post-processing equation.

The second post-processing equation and/or a modified version can be used to calculate/predict values for the chip/dies in column five and column six. The second post-processing equation can be modified as necessary to better fit the measured data in column six (measurement sites 5, and 6) and in column five (measurement sites 4, and 3). An error condition can be declared when the second post-processing equation cannot be determined and/or modified properly. In addition, an error condition can be declared when one or more of the measured values and/or calculated/predicted values are outside a uniformity limit established for the wafer.

The second post-processing equation and/or a modified version can also be used to calculate/predict values for the remaining sites on the wafer. In one embodiment, the entire second post-processing prediction map can be calculated using the second post-processing equation and/or a modified version. An error condition can be declared when one or more of the values calculated and/or predicted values are outside a uniformity limit established for the wafer. Alternatively, the second post-processing equation and/or a modified version may be used to calculate/predict values for a portion of the wafer. For example, the portion may include one or more quadrants.

Alternatively, the first post-processing prediction map can be calculated using only the first pre-processing equation and/or the second prediction post-processing map can be calculated using only the second post-processing equation. For example, a procedure such as this could be used to reduce the processing time for substantially uniform processes.

In task 665, one or more post-processing confidence maps can be calculated. FIG. 15 shows a simplified view of a post-processing confidence map 1520 including a plurality of chip/dies 1510, the previously discussed twelve measurement sites 1530 numbered (1-12), and a reference side 1540 that can indicate a notch location. In one embodiment, a post-processing confidence map can be calculated using the differences between the first post-processing prediction map and the second post-processing prediction map. Alternatively, a post-processing confidence map may be calculated using the differences between a post-processing prediction map and a reference measurement map.

As shown in the illustrated embodiment, a confidence map can be divided into different areas as shown using the values "C1" and "C2" and different values and/or rules can be established for the different areas. For example, two areas can be used to account for differences between a center region and an edge region. Alternatively, a different number of areas may be used.

In another embodiment, a post-processing confidence map can be calculated using the differences between a post-processing prediction map and the uniformity limits established for the wafer. For example, when a value in a prediction map is close to uniformity limit, the confidence value may be lower than when the value in a prediction map is not close to uniformity limit.

In one embodiment, a first kind of post-processing confidence map provides an estimate of the confidence in the measured data, in other words, whether the predicted measured data is correct. Since it would take too long to measure the entire wafer, a smaller number of measurement sites is being used and confidence factors must be establish to ensure that the predicted measured data accurately represents the data that would be obtained if more sites or a larger portion of the wafer was used to make the measurements. A second kind of post-processing confidence map can provide an estimate of the confidence in the trimming process. Since it would take too long to measure the entire wafer after it has been processed and a semiconductor manufacturer would like to be sure that the process has been performed correctly, the actual measured data and/or the predicted measured data can be compared to the expected target values and when these numbers are with specified limits, the semiconductor manufacturer can assume that the process was performed correctly even though the entire wafer has not been measured.

In task 670, a query can be performed to determine when to establish a prioritized site based on the post-processed data. When the values in all areas of the post-processing confidence map are high, it is not necessary to establish a new prioritized site. In other embodiments, when the differences between the prediction maps are small and/or when the differences between the post-processing prediction map and a reference measurement map are small, it is not necessary to establish a new prioritized site.

In addition, when the values on a post-processing confidence map are consistently high for a particular process, a new measurement plan may be establish that uses a smaller number of measurement sites and that decreases the throughput time.

When one or more values in one or more areas of the post-processing confidence map are low, one or more new prioritized sites can be established in those areas. In other embodiments, when the differences between the post-processing prediction maps are large and/or when the differences between the post-processing prediction map and a reference measurement map are large, one or more new prioritized sites can be established. For example, prioritized sites can be established for the entire wafer or for a particular area such as a particular quadrant (Q1, Q2, Q3, or Q4).

When a post-processing prioritized site is required, procedure 600 can branch to task 675, and when a post-processing prioritized site is not required, procedure 600 can branch to task 680.

In task 675, one or more prioritized sites can be established. FIG. 16 shows a simplified view of a new post-processing measurement map 1620 including a plurality of chip/dies 1610, a new post-processing measurement site 1635, the previously discussed twelve measurement sites 1630 labeled as (1-12), and a reference side 1640 that can indicate a notch location on a wafer or a specific side of a substrate. Alternatively, a new post-processing measurement map may include a plurality of prioritized sites at different locations on the wafer. When confidence values are low in one area of the wafer, one or more prioritized sites can be established in that area as post-processing measurement sites. For example, when to confidence values are low in the first quadrant (Q1) chip/site (3-2) may be identified as the prioritized site and the metrology tool is instructed to make measurements at the site.

When a new post-processing prioritized site is required, a new post-processing metrology recipe can be created, and the new recipe can be used to instruct the metrology tool to make additional post-processing measurements at the one or more prioritized sites. When the post-processing confidence map is calculated while the wafer is in the metrology tool, the additional measurements at newly established prioritized sites can be performed with the minimum amount of delay. When the post-processing confidence map is calculated after the wafer has left the metrology tool, the new recipe can be used at a later time, and the additional measurements at the prioritized sites can be performed after some delay time.

In one embodiment, when the measured data for a prioritized site is created, it can be compared to the data in the post-processing prediction maps. Alternatively, when the measured data for a prioritized site is created, it can be stored and compared to the data in the post-processing prediction maps at a later time. An error condition can be declared when the measured data for a prioritized site is outside a limit established by a wafer uniformity specification.

When the measured data for a prioritized site is close to the value in a particular prediction map, that prediction map can be used in the area around the prioritized site. For example, when the one or more prioritized sites are in the first quadrant and the measured value(s) are close to the value(s) in the first post-processing prediction map, then the first post-processing prediction map can be used in the first quadrant.

When the measured data for a prioritized site is not close to the value in a particular prediction map, a new prediction map can be created and can be used in the area around the prioritized site. For example, when the one or more prioritized sites are in the first quadrant and the measured value(s) are not close to the value(s) in the pre-processing prediction maps, then a new pre-processing prediction map can be created and used in the first quadrant.

Whenever a post-processing prediction map changes, a new post-processing confidence map or a new portion of a post-processing confidence map can be calculated.

When a new post-processing measurement recipe is created for the metrology tool, the new measurement recipe can be used at a later time to instruct the metrology tool to make measurements at the one or more prioritized sites. For example, the new measurement recipe can be used to measure the next wafer or some other wafer. Alternatively, the current wafer can be moved into a metrology tool, and the new post-processing measurement recipe can be used to re-measure it.

Whenever a post-processing prediction map changes, a new post-processing confidence map or a new portion of a post-processing confidence map can be calculated. In addition, an averaged post-processing prediction map may be calculated. For example, the averaged post-processing predicted map can be calculated for the entire wafer or for a particular area such as a particular quadrant (Q1, Q2, Q3, or Q4).

In task 680, a query can be performed to determine when to perform another post-processing measurement process. When the process is mature, the process results should be constant and the post-processing measurement process should not be required. However, some wafers may be identified as process verification wafers and a post-processing measurement process can be performed on these wafers. When the process is immature and the process results are varying, the post-processing measurement process can be performed. When another post-processing measurement process is not required, procedure 600 can branch to task 685, and when post-processing measurement process is required, procedure 600 can branch to task 655.

In one embodiment, when one or more prioritized sites have been identified, a post-processing measurement process can be performed at the one or more prioritized sites.

In one embodiment, a previously calculated prediction map is used as the measured data map. Alternatively, a modified prediction map may be used.

In task 685, a query can be performed to determine when an additional wafer requires processing. When a process is performed, a number of wafers can be processed as a lot or a batch. When additional wafer processing is not required, procedure 600 can branch to task 690, and when an additional wafer requires processing, procedure 600 can branch to task 610.

Procedure 600 can end in 690.

In alternate embodiments, a Tunable Etch Resistance ARC (TERA) material may be used as a BARC material and/or an ARC material and/or a hard mask material, and the gate material may include GaAs, SiGe, and strained silicon.

Figure 17A:
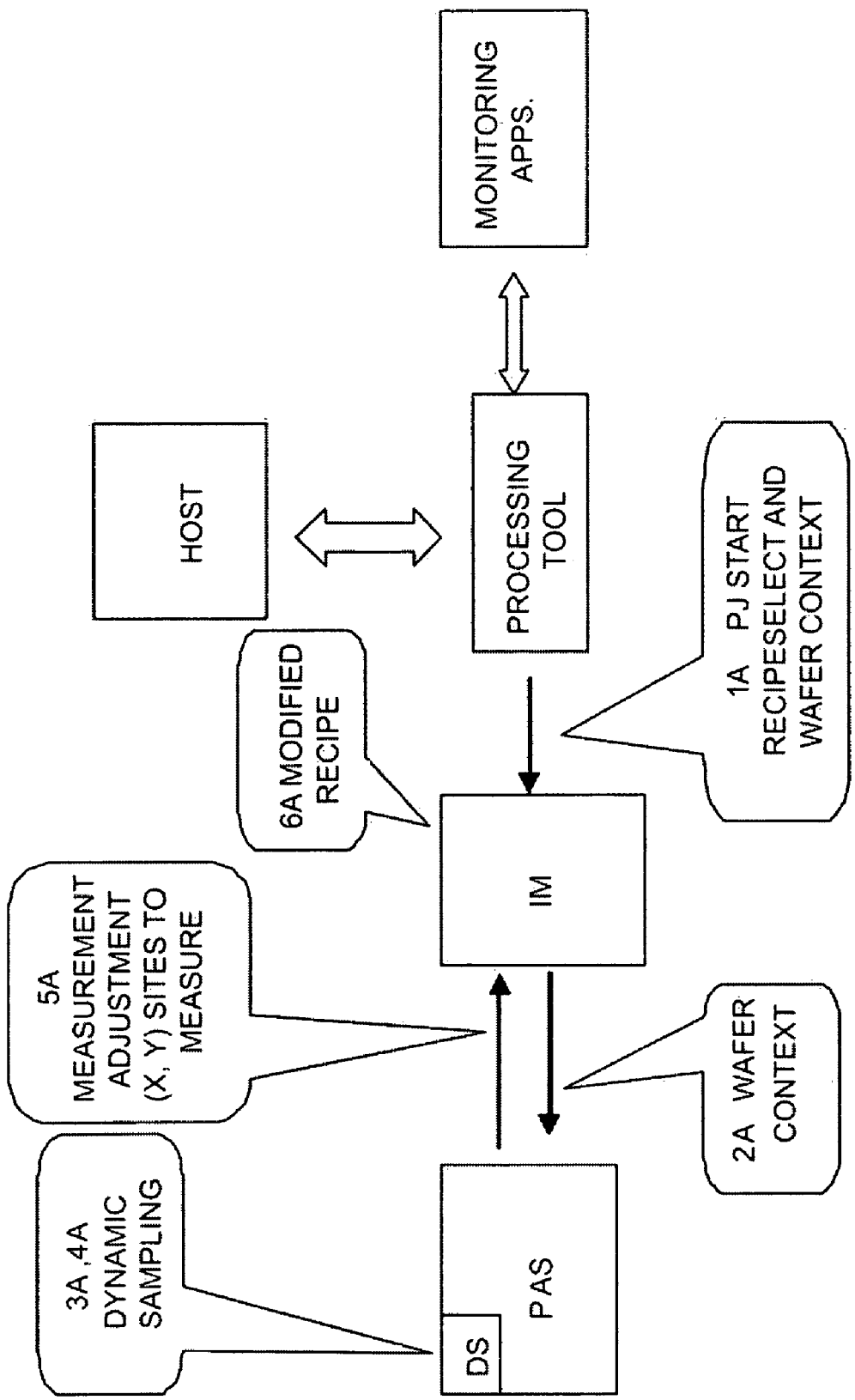
FIGS. 17A, 17B, and 17C illustrate different processing methods for performing dynamic sampling in accordance with embodiments of the invention.
Figure 17B:
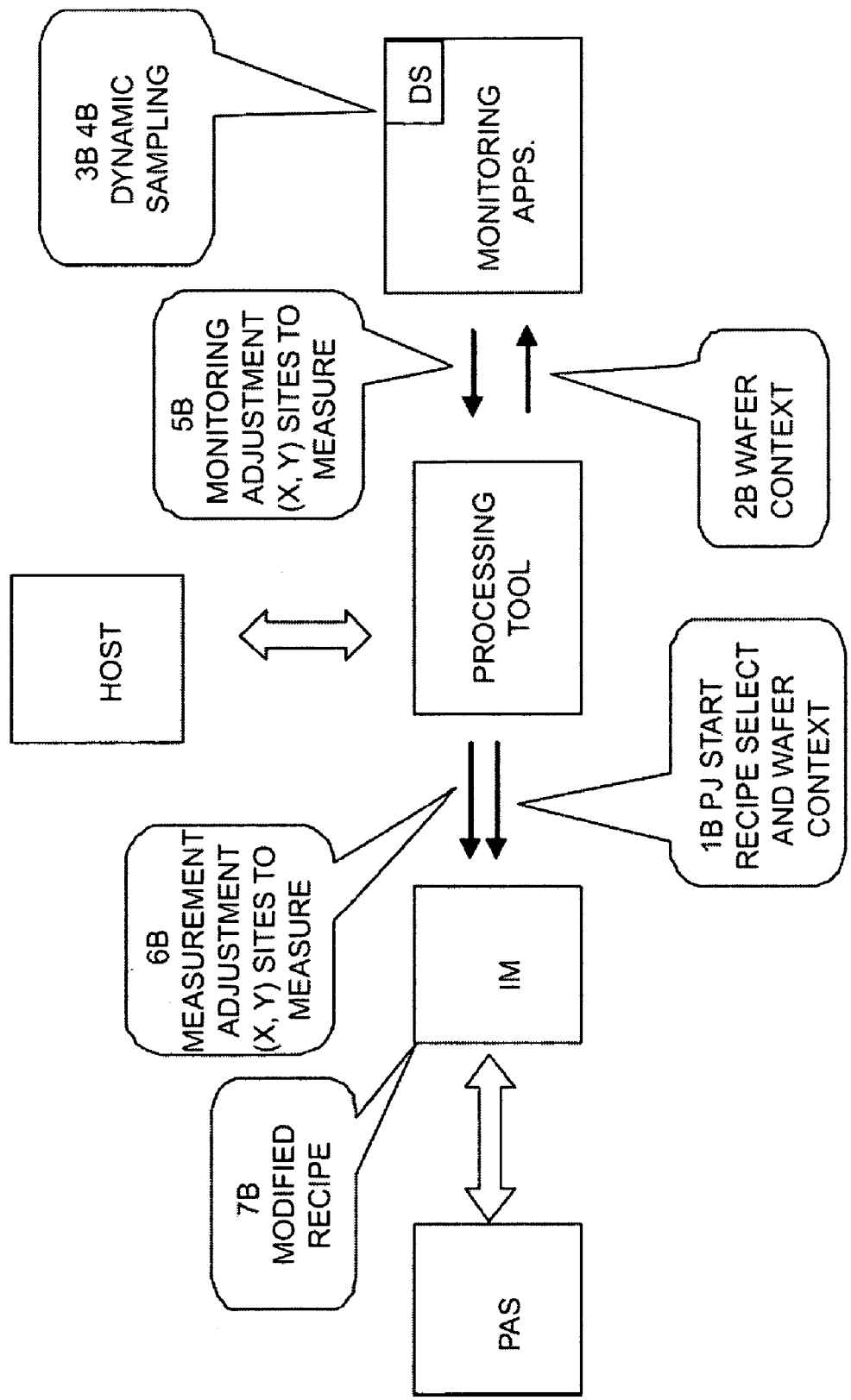
Figure 17C:
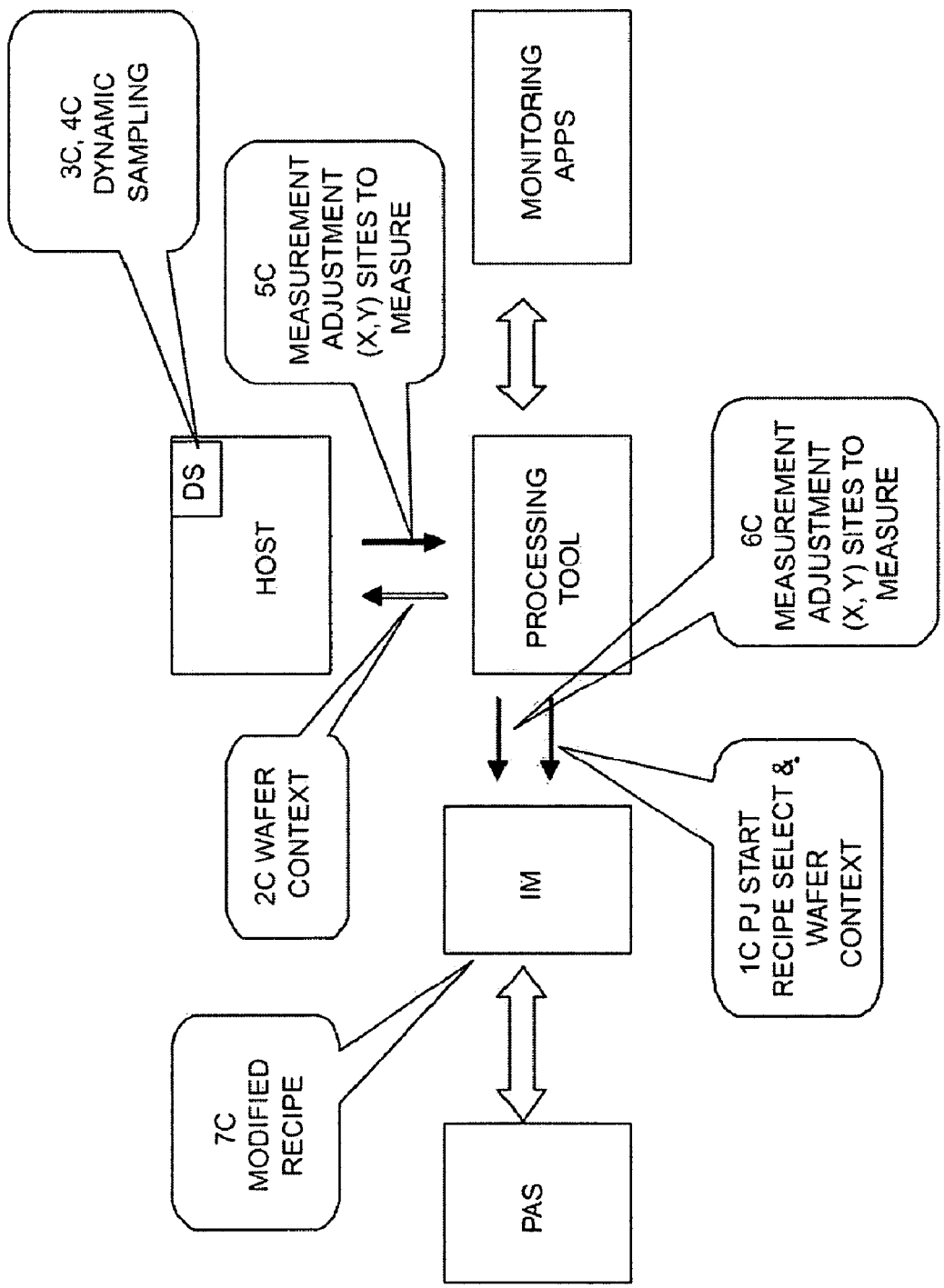

FIGS. 17A-17C illustrate different processing methods for performing dynamic sampling in accordance with embodiments of the invention. The application that computes the wafer measurement recipe settings (variable recipe adjustment for metrology) can be implemented with three different methods: the first method uses the Measurement Analysis System (Timbre® PAS), the second method uses the Tool Process Control System (Telius®/Ingenio®), and the third method uses the Factory Host.

In the illustrated embodiment shown in FIG. 17A, one or more of the dynamic sampling applications can be performed by a PAS controller in the Measurement Analysis System. In 1A, a recipe list can be sent to IM with wafer context and a PJ Start command can be used. In 2A, the IM can send wafer context to a PAS controller and an optional wafer map may be included. In 3A, the PAS controller can evoke one or more Dynamic Sampling (DS) applications. In 4A, a DS application can be used to compute the wafer map site location adjustments. In 5A, the PAS controller can send a variable adjust message to IM. In 6A, the IM can make the measurements with modified recipe.

In the illustrated embodiment shown in FIG. 17B, one or more of the dynamic sampling applications can be performed by a controller in an Advanced Process Control (APC) System. In 1B, a recipe list can be sent to IM with wafer context and a PJ Start command can be used. In 2B, the tool can send wafer context to an APC controller and an optional wafer map may be included. In 3B, the APC controller can evoke one or more DS applications. In 4B, a DS application can be used to compute the wafer map site location adjustments. In 5B, the tool controller can receive a variable adjustment message from the APC controller. In 6B, the tool controller can send a variable adjustment message to IM. In 7B, the IM can make the measurements with modified recipe.

In the illustrated embodiment shown in FIG. 17C, one or more of the dynamic sampling applications can be performed by a controller in a Host System. In 1C, a recipe list can be sent to the IM with wafer context and a PJ Start command can be used. In 2C, the tool can send wafer context to a Host controller and an optional wafer map may be included. In 3C, the Host controller can evoke one or more DS applications. In 4C, a DS application can be used to compute the wafer map site location adjustments. In 5C, the host can send a variable adjustment message to the processing tool. In 6C, the tool controller can send a variable adjustment message to IM. In 7C, the IM can make the measurements with modified recipe.

Referring back to FIG. 1, the controller 120 can use the difference between the measurement maps for the incoming material (input state) and process results maps (desired state) to predict, select, or calculate a set of process parameters to achieve the desired result of changing the state of the wafer from the input state to the desired state. For example, this predicted set of process parameters can be a first estimate of a recipe to use to provide a uniform process. In addition, measurement maps and/or process results maps can be obtained from the MES 130 and can be used to update the first estimate.

The controller 120 can compute a predicted state map for the wafer based on one or more input state maps, one or more processing module characteristics maps, and one or more process models. For example, a trim rate map can be used along with a processing time to compute a predicted trim amount map. Alternately, an etch rate map can be used along with a processing time to compute an etch depth map, and a deposition rate map can be used along with a processing time to compute a deposition thickness map.

The controller 120 can use the post-processing measurement maps and/or data to compute a first set of process deviations. This computed set of process deviations can be determined based on one or more desired process results maps and the actual process results map determined from one or more of the post-processing measurement maps. In one case, the controller 120 obtains the required maps, and the controller 120 determines the differences between the desired state and the actual state using one or more maps. In this manner, one or more measured actual process results maps can be compared with one or more desired process results maps in order to determine a correction to the process recipe. For example, the "results" maps can include top CD maps, bottom CD maps, sidewall angle maps, and corrections can be made to the process recipes for the trim processes, the BARC open etching processes, and/or the iso/nested etching processes.

In another case, the controller 120 can obtain one or more predicted state maps and one or more output state maps for the wafer, and the controller 120 determines the differences between the predicted state maps and the output state maps. In this manner, a measured actual process result map can be compared with a predicted process result map in order to determine corrections to one or more process model and/or maps. For example, the "results" maps can include top CD maps, bottom CD maps, sidewall angle maps, and corrections can be made to the process models for the trim processes, the BARC open etching processes, and/or the iso/nested etching processes.

Maps can be updated using feed-back data that can be generated by running monitor, test, and/or production wafers, varying the process settings and observing the results, then updating one or more different maps. For example a map update can take place every N processing hours by measuring the before and after characteristics of a monitor wafer. By changing the settings over time to check different operating regions, the complete operating space can be validated over time, or run several monitor wafers at once with different recipe settings. The map update can take place within the controller 120, at the processing tool, or at the factory, allowing the factory to control and/or manage the monitor wafers and map updates.

The controller 120 can update maps at one or more points in a processing sequence. In one case, the controller 120 can use the feed-forward information, modeling information, and the feedback information to determine whether or not to change one or more of the currently used maps before running the current wafer, before running the next wafer, or before running the next lot.

In determining a confidence factor for a process, a required process result map can be used. The required process result map can comprise the difference between the desired process result map and the actual measured data map. Desired process result data, such as target data, can be compared to measured data. For example, the desired process result map can comprise at least one of a desired trench area map, a desired material thickness map, a desired sidewall angle map, a desired grating thickness map, a desired cross sectional area map, a desired CD width map, a desired CD depth map, a desired feature profile map, a desired trim amount map, a desired differential depth map, a desired uniformity map, and a desired differential width map.

When mapping application is being performed, the source of map may be important and may be identified in advance. For example, maps may be either externally generated or internally generated. The externally generated map can be provided by the MES 130. The internally generated map can be created using calculated values and/or an input from a GUI. In addition, business rules can be provided that can be used to determine when to use an externally generated map or an internally generated map. Maps must be evaluated and pre-qualified before they can be used.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed is:

1. A method of processing a wafer comprising:

receiving a wafer, wherein the wafer comprises a plurality of dies, each die having a patterned bi-layer mask thereon, wherein the bi-layer mask includes a soft mask layer and a hard mask layer;

creating a pre-processing measurement map using measured metrology data for the wafer including metrology data for at least one isolated bi-layer structure on the wafer, metrology data for at least one nested bi-layer structure on the wafer, or mask data;

calculating a first pre-processing prediction map for the wafer based on the pre-processing measurement map, the first pre-processing prediction map including a first set of predicted measured data for the plurality of dies on the wafer;

calculating a pre-processing confidence map for the wafer, the pre-processing confidence map including a set of confidence data for the plurality of dies on the wafer, wherein the confidence data is determined using a difference between the first pre-processing prediction map and historical data;

determining a prioritized measurement site when the confidence data for one or more dies is not within the confidence limits;

creating a new measurement recipe that includes the prioritized measurement site; calculating control settings for the wafer when the confidence data for substantially all of the dies is within the confidence limits; and processing the wafer using the calculated control settings; and determining a first value using a feature size for the at least one isolated structure on the wafer, wherein the soft mask layer comprises photoresist material and the hard mask layer comprises Bottom Anti-Reflective Coating (BARC)layer; determining a second value using a feature size for the at least one nested structure on the wafer; executing an Iso-Greater control strategy when the first value is greater than the second value, wherein the Iso-Greater control strategy comprises an Iso/Nested control plan for controlling an iso/nested etching process, a Trim Control plan for controlling a trimming process, or a BARC open control plan for controlling a BARC etching process, or a combination of two or more thereof; and executing a Nes-Greater control strategy when the first value is less than the second value, wherein the Nes-Greater control strategy comprises an Iso/Nested control plan for controlling an iso/nested deposition process, a Trim Control plan for controlling a trimming process, or a BARC open control plan for controlling a BARC etching process, or a combination of two or more thereof.

2. The method as claimed in claim 1, further comprising:
creating a new pre-processing measurement map using new measured metrology data for the wafer, wherein new measurement recipe is used to measure the wafer when creating the new pre-processing measurement map;
calculating a new pre-processing prediction map for the wafer, the new pre-processing prediction map including a new set of predicted measured data for the plurality of dies on the wafer;
calculating a new confidence map for the wafer, the new confidence map including a new set of confidence data for the plurality of dies on the wafer, wherein the new confidence data is determined using the first pre-processing prediction map, the historical data, or the new pre-processing map, or a combination thereof;
establishing an error condition when the new confidence data for one or more dies is not within the confidence limits; and
processing the wafer when the new confidence data for substantially all of the dies is within the confidence limits.

3. The method as claimed in claim 1, further comprising:
calculating a second pre-processing prediction map for the wafer, the second pre-processing prediction map including a second set of predicted measured data for the plurality of dies on the wafer; and
calculating the pre-processing confidence map for the wafer, the pre-processing confidence map including a set of confidence data for the plurality of dies on the wafer, wherein the confidence data is determined using a difference between the first pre-processing prediction map and the second pre-processing prediction map.

4. The method as claimed in claim 3, wherein:
the calculating of the first pre-processing prediction map for the wafer uses a first pre-processing equation, the first pre-processing equation being determined using measured data from two or more measurement sites located in a first direction; and
the calculating of the second pre-processing prediction map for the wafer uses a second pre-processing equation, the second pre-processing equation being determined using measured data from two or more measurement sites located in a second direction.

5. The method as claimed in claim 3, wherein:
the calculating of the first pre-processing prediction map for the wafer uses a first pre-processing surface, the first pre-processing surface being determined using measured data from two or more measurement sites located in a first radial direction; and
the calculating of the second pre-processing prediction map for the wafer uses a second pre-processing surface, the second pre-processing surface being determined using measured data from two or more measurement sites located in a second radial direction.

6. The method as claimed in claim 3, wherein the calculating of the pre-processing confidence map for the wafer compares one or more uniformity limits to the first pre-processing prediction map, the second pre-processing prediction map, or a averaged pre-processing prediction map.

7. The method as claimed in claim 3, wherein the determining of the prioritized measurement site establishes the prioritized measurement site in a first area of the wafer when one or more dies in the first area has a value in the first pre-processing prediction map, the second pre-processing prediction map, or an averaged pre-processing prediction map that exceeds one or more uniformity limits.

8. The method as claimed in claim 3, wherein the determining of the prioritized measurement site establishes the prioritized measurement site in a first area of the wafer when one or more dies in the first area has a difference value that exceeds one or more uniformity limits in the first area, wherein the difference value is calculated using a difference between a reference measurement map and the first pre-processing prediction map, the second pre-processing prediction map, or a averaged pre-processing prediction map.

9. The method as claimed in claim 3, wherein the determining of the prioritized measurement site establishes the prioritized measurement site in a first area of the wafer when one or more dies in the first area has a difference value that exceeds one or more uniformity limits in the first area, wherein the difference value is calculated using a difference between a uniformity limit and the first pre-processing prediction map, the second pre-processing prediction map, or a averaged pre-processing prediction map.

10. The method as claimed in claim 1, further comprising:
creating a new pre-processing measurement map using new measured metrology data for the wafer, wherein new measurement recipe is used to measure the wafer when creating the new pre-processing measurement map;
calculating a new pre-processing prediction map for the wafer, the new pre-processing prediction map including a new set of predicted measured data for the plurality of dies on the wafer;
calculating a new confidence map for the wafer, the new confidence map including a new set of confidence data for the plurality of dies on the wafer, wherein the new confidence data is determined using the first pre-processing prediction map, the second pre-processing prediction map, or the new pre-processing map, or a combination thereof;
establishing an error condition when the new confidence data for one or more dies is not within the confidence limits; and
processing the wafer when the new confidence data for substantially all of the dies is within the confidence limits.

11. The method as claimed in claim 1, further comprising:
measuring the processed wafer in a metrology module when post-processing metrology data is required;
transferring the processed wafer to a holding area when post-processing metrology data is not required; and
receiving a new wafer.

12. The method as claimed in claim 11, further comprising:
measuring the processed wafer in a metrology module;
creating a post-processing measurement map using measured metrology data for the processed wafer including metrology data for at least one processed isolated structure on the wafer and metrology data for at least one processed nested structure on the wafer;
calculating a first post-processing prediction map for the processed wafer, the first post-processing prediction map including a first set of predicted measured data for the plurality of dies on the processed wafer;
calculating a post-processing confidence map for the processed wafer, the post-processing confidence map including a set of confidence data for the plurality of dies on the processed wafer, wherein the confidence data is determined using a difference between the first post-processing prediction map and the historical data;

determining a post-processing prioritized measurement site when the confidence data for one or more dies is not within the confidence limits; and creating a new measurement recipe that includes the prioritized measurement site.

13. The method as claimed in claim 11, further comprising:
measuring the processed wafer in a metrology module;

creating a post-processing measurement map using measured metrology data for the processed wafer including metrology data for at least one processed isolated structure on the wafer and metrology data for at least one processed nested structure on the wafer;

calculating a first post-processing prediction map for the processed wafer, the first post-processing prediction map including a first set of predicted measured data for the plurality of dies on the processed wafer;

calculating a second post-processing prediction map for the processed wafer, the second post-processing prediction map including a second set of predicted measured data for the plurality of dies on the processed wafer;

calculating a post-processing confidence map for the processed wafer, the post-processing confidence map including a set of confidence data for the plurality of dies on the processed wafer, wherein the confidence data is determined using a difference between the first post-processing prediction map and the second post-processing prediction map;

determining a post-processing prioritized measurement site when the confidence data for one or more dies is not within the confidence limits; and creating a new measurement recipe that includes the prioritized measurement site.

14. The method as claimed in claim 13, wherein:
the calculating of the first post-processing prediction map for the wafer uses a first post-processing equation, the first post-processing equation being determined using measured data from two or more measurement sites located in a first direction; and the calculating of the second pre-processing prediction map for the wafer uses a second post-processing equation, the second post-processing equation being determined using measured data from two or more measurement sites located in a second direction.

15. The method as claimed in claim 13, wherein:
the calculating of the first post-processing prediction map for the wafer uses a first post-processing surface, the first post-processing surface being determined using measured data from two or more measurement sites located in a first radial direction; and the calculating of the second post-processing prediction map for the wafer uses a second post-processing surface, the second post-processing surface being determined using measured data from two or more measurement sites located in a second radial direction.

16. The method as claimed in claim 13, wherein the calculating of the post-processing confidence map for the wafer uses a difference between a reference measurement map and the first post-processing prediction map, the second post-processing prediction map, or a averaged post-processing prediction map.

17. The method as claimed in claim 13, wherein the calculating of the post-processing confidence map for the wafer uses a difference between the first post-processing prediction map and the second post-processing prediction map.

18. The method as claimed in claim 13, wherein the calculating of the post-processing confidence map for the wafer compares one or more uniformity limits to the first post-processing prediction map, the second post-processing prediction map, or a averaged post-processing prediction map.

19. The method as claimed in claim 13, wherein establishing the prioritized measurement site in a first area of the wafer when one or more dies in the first are has a value in the first post-processing prediction map, the second post-processing prediction map, or an averaged post-processing prediction map that exceeds one or more uniformity limits.

20. The method as claimed in claim 13, wherein the determining of the post-processing prioritized measurement site establishes the prioritized measurement site in a first area of the wafer when one or more dies in the first area has a difference value that exceeds one or more uniformity limits in the first area, wherein the difference value is calculated using a difference between a reference measurement map and the first post-processing prediction map, the second post-processing prediction map, or a averaged post-processing prediction map.

21. The method as claimed in claim 13, wherein the determining of the post-processing prioritized measurement site establishes the prioritized measurement site in a first area of the wafer when one or more dies in the first are has a difference value that exceeds one or more uniformity limits in the first area, wherein the difference value is calculated using a difference between a uniformity limit and the first post-processing prediction map, the second post-processing prediction map, or a averaged post-processing prediction map.

22. The method as claimed in claim 11, further comprising:
re-measuring the processed wafer in the metrology module using the new measurement recipe when the new measurement recipe is created while the processed wafer is in the metrology module;

creating a new post-processing measurement map, wherein new measurement recipe is used to measure the processed wafer when creating the new post-processing measurement map;

calculating a new post-processing prediction map for the processed wafer, the new post-processing prediction map including a new set of predicted measured data for the plurality of dies on the processed wafer;

calculating a new confidence map for the processed wafer, the new confidence map including a new set of confidence data for the plurality of dies on the processed wafer, wherein the new confidence data is determined using the first post-processing prediction map, the second post-processing prediction map, or the new post-processing map, or a combination thereof;

establishing an error condition when the new confidence data for one or more dies is not within the confidence limits; and removing the processed wafer from the metrology module when the new confidence data for substantially all of the dies is within the confidence limits.

23. The method as claimed in claim 1, wherein the calculating of the pre-processing confidence map for the wafer uses a difference between a reference measurement map and the first pre-processing prediction map, a historical pre-processing prediction map, or a averaged pre-processing prediction map.

24. The method as claimed in claim 1, wherein the calculating of the pre-processing confidence map for the wafer uses a difference between the first pre-processing prediction map and a historical pre-processing prediction map.

* * * * *